(12) United States Patent
Sawase et al.

(10) Patent No.: US 9,190,513 B2
(45) Date of Patent: Nov. 17, 2015

(54) N-CHANNEL DOUBLE DIFFUSION MOS TRANSISTOR WITH P-TYPE BURIED LAYER UNDER N-TYPE DRIFT LAYER, AND SEMICONDUCTOR COMPOSITE DEVICE

(71) Applicant: ROHM CO., LTD., Kyoto (JP)

(72) Inventors: Kensuke Sawase, Kyoto (JP); Motohiro Toyonaga, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/158,707

(22) Filed: Jan. 17, 2014

(65) Prior Publication Data

US 2014/0210002 A1   Jul. 31, 2014

(30) Foreign Application Priority Data

Jan. 25, 2013 (JP) ................................ 2013-012276

(51) Int. Cl.
| | |
|---|---|
| *H01L 29/78* | (2006.01) |
| *H01L 21/8249* | (2006.01) |
| *H01L 27/06* | (2006.01) |
| *H01L 29/10* | (2006.01) |
| *H01L 49/02* | (2006.01) |

(Continued)

(52) U.S. Cl.
CPC ........ *H01L 29/7825* (2013.01); *H01L 21/8249* (2013.01); *H01L 27/0623* (2013.01); *H01L 27/0635* (2013.01); *H01L 28/10* (2013.01); *H01L 28/40* (2013.01); *H01L 29/1083* (2013.01); *H01L 29/7816* (2013.01); *H01L 29/7833* (2013.01); *H01L 21/823814* (2013.01); *H01L 21/823892* (2013.01); *H01L 29/665* (2013.01)

(58) Field of Classification Search
CPC ........................... H01L 27/06; H01L 29/7825
USPC ................... 257/334, 335, 330, 501
See application file for complete search history.

(56) References Cited

U.S. PATENT DOCUMENTS

| | | | |
|---|---|---|---|
| 6,236,084 B1* | 5/2001 | Harada et al. ................. | 257/338 |
| 7,776,700 B2* | 8/2010 | Yang et al. .................... | 438/286 |
| 8,173,500 B2* | 5/2012 | Jun .............................. | 438/202 |

(Continued)

OTHER PUBLICATIONS

Il Yong Park et al., "3D180—a new 0.18 pm BCD (Bipolar-CMOS-DMOS) Technology from 7V to 60V" Proceedings of the 20th International Symposium on Power Semiconductor Devices & IC's, pp. 64-67, May 18-22, 2008.

(Continued)

*Primary Examiner* — Marc Armand
*Assistant Examiner* — Younes Boulghassoul
(74) *Attorney, Agent, or Firm* — Rabin & Berdo, P.C.

(57) ABSTRACT

A MOS transistor includes a p-type semiconductor substrate, a p-type epitaxial layer, and an n-type buried layer provided in a boundary between the semiconductor substrate and the epitaxial layer. In a p-type body layer provided in a surface portion of the epitaxial layer, an n-type source layer is provided to define a double diffusion structure together with the p-type body layer. An n-type drift layer is provided in a surface portion of the epitaxial layer in spaced relation from the body layer. An n-type drain layer is provided in a surface portion of the epitaxial layer in contact with the n-type drift layer. A p-type buried layer having a lower impurity concentration than the n-type buried layer is buried in the epitaxial layer between the drift layer and the n-type buried layer in contact with an upper surface of the n-type buried layer.

18 Claims, 13 Drawing Sheets

(51) Int. Cl.
    *H01L 21/8238*     (2006.01)
    *H01L 29/66*       (2006.01)

(56) References Cited

U.S. PATENT DOCUMENTS

| | | | |
|---|---|---|---|
| 8,809,991 B2 * | 8/2014 | Park | 257/501 |
| 8,816,434 B2 * | 8/2014 | Grote et al. | 257/343 |
| 2002/0060341 A1 * | 5/2002 | Terashima | 257/335 |
| 2007/0045767 A1 * | 3/2007 | Zhu et al. | 257/505 |
| 2010/0051946 A1 | 3/2010 | Jun | |
| 2010/0096697 A1 * | 4/2010 | Su et al. | 257/343 |
| 2010/0314683 A1 * | 12/2010 | Yanagi | 257/339 |

OTHER PUBLICATIONS

Il Yong Park et al., "BCD (Bipolar-CMOS-DMOS) Technology Trends for Power Management IC" 8th International Conference on Power Electronics—ECCE Asia, The Shilla Jeju, Korea, pp. 318-325, May 30-Jun. 3, 2011.

* cited by examiner

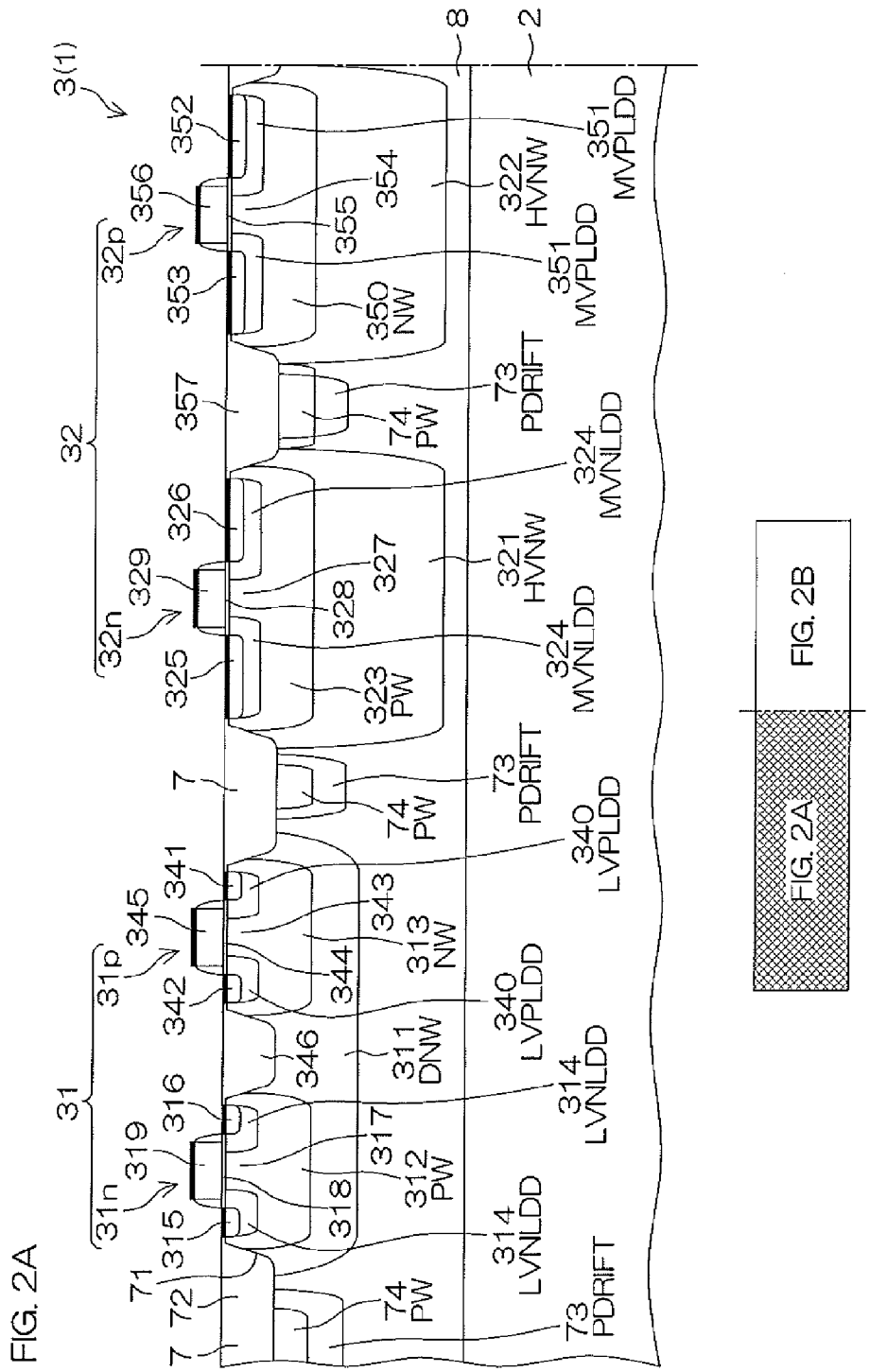

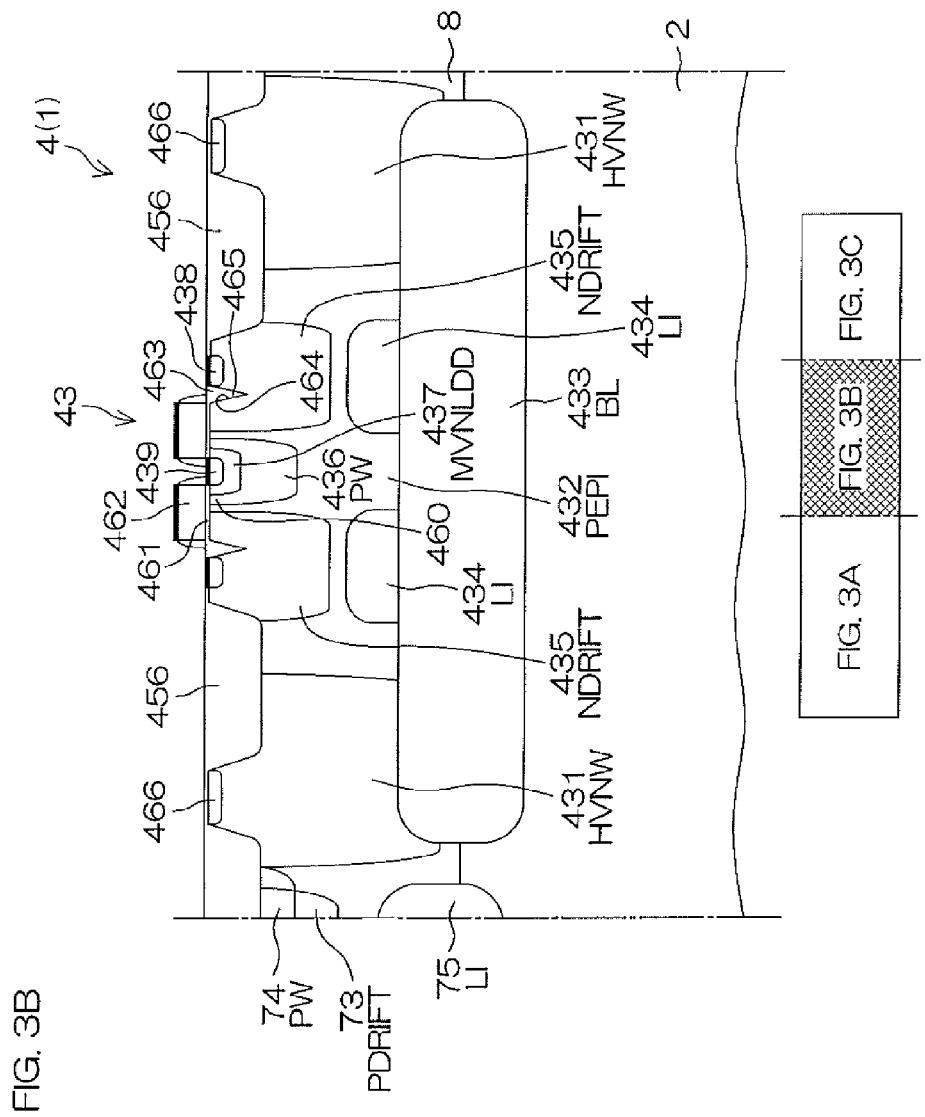

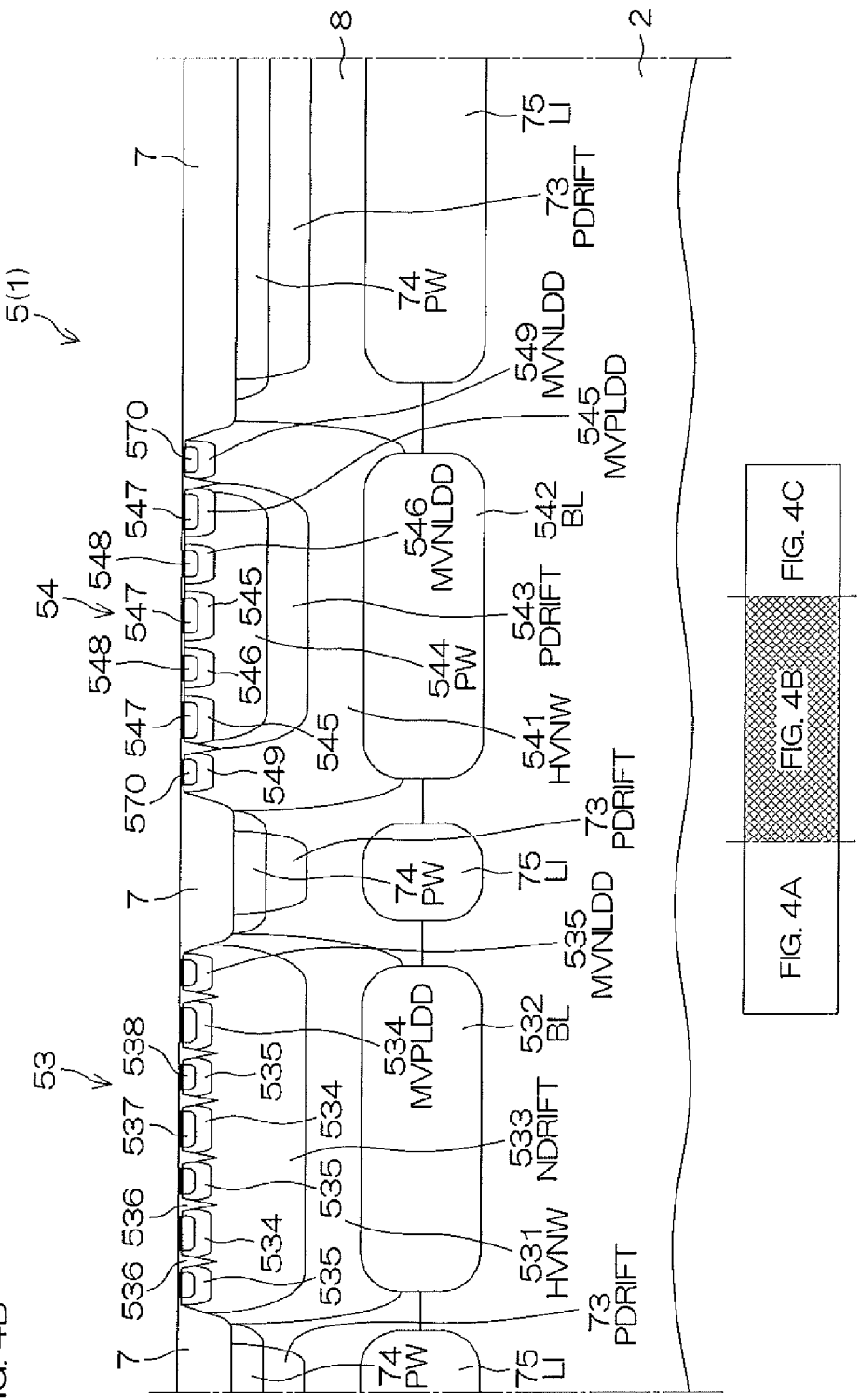

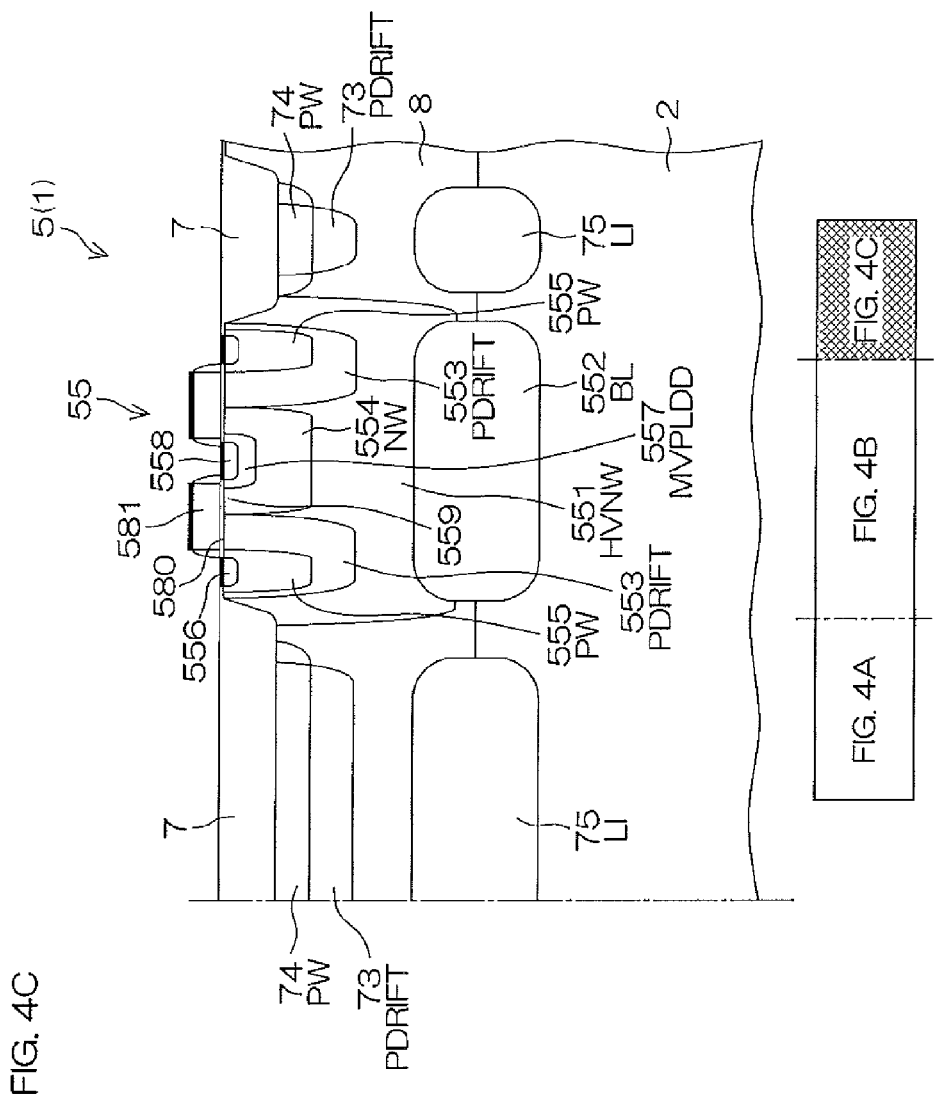

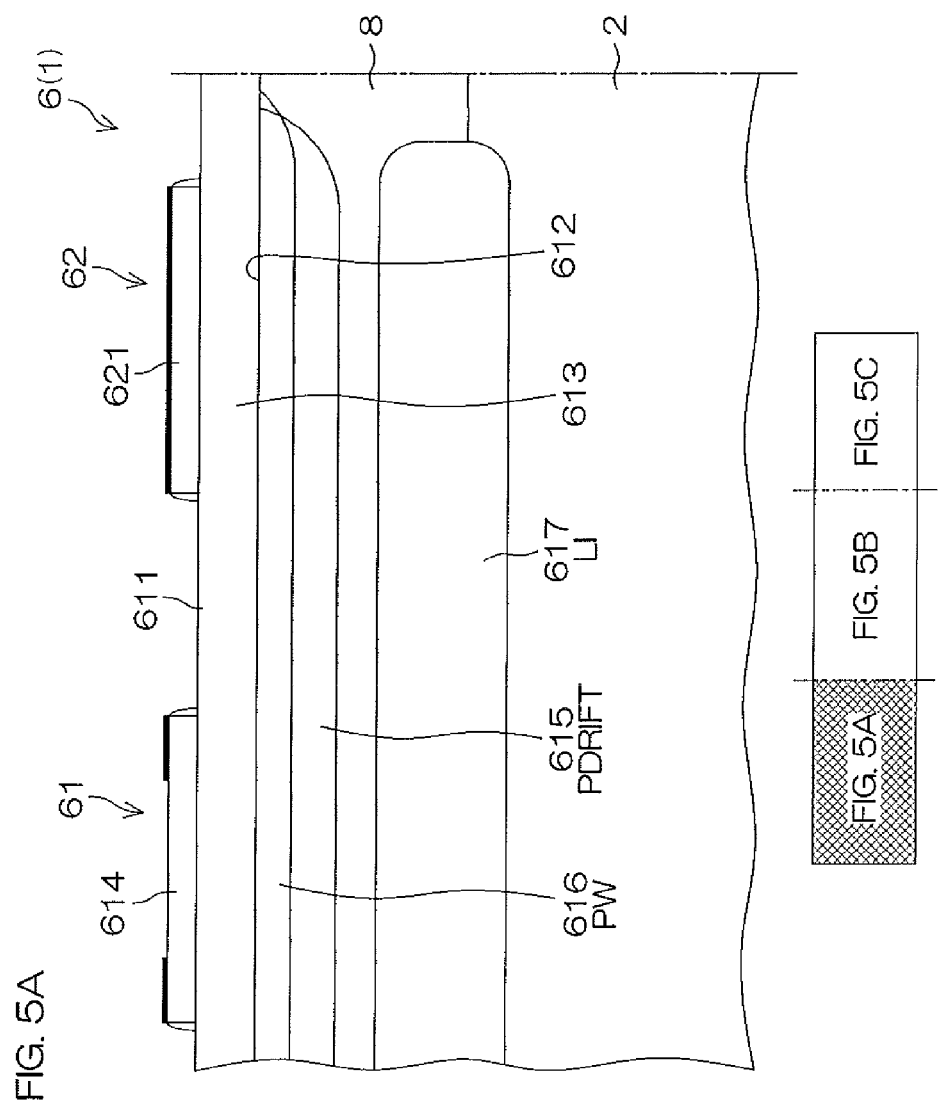

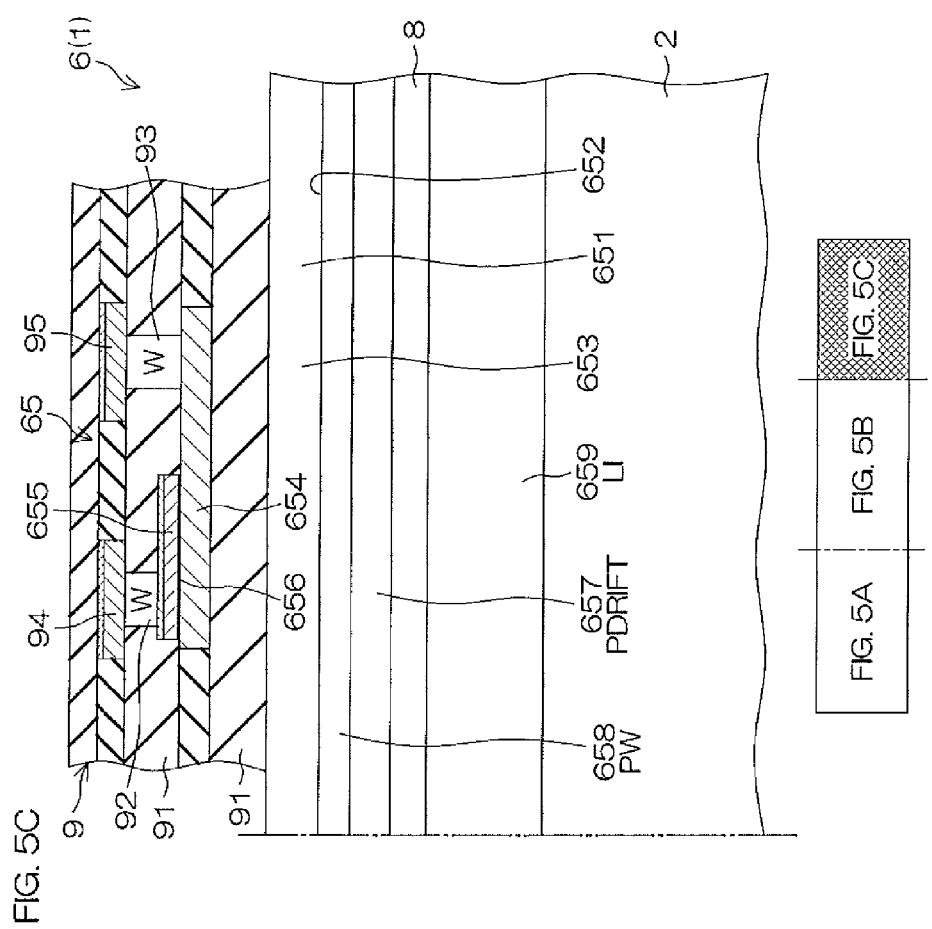

N-CHANNEL DOUBLE DIFFUSION MOS TRANSISTOR WITH P-TYPE BURIED LAYER UNDER N-TYPE DRIFT LAYER, AND SEMICONDUCTOR COMPOSITE DEVICE

BACKGROUND OF THE INVENTION

1. Field of the Invention

The present invention relates to an n-channel double diffusion MOS (Metal Oxide Semiconductor) transistor, and a semiconductor composite device including the same.

2. Description of Related Art

US2010/0051946A1 discloses a BiCDMOS (Bipolar CMOS DMOS) device which is a semiconductor composite device including a bipolar element, a CMOS (Complementary MOS) transistor and a DMOS (Double Diffusion MOS) transistor provided on a common semiconductor substrate. An n-channel DMOS transistor generally has an n-type well provided on a p-type semiconductor substrate with the intervention of an n-type buried layer. In a surface portion of the n-type well, a p-type body layer and an n-type drift layer are provided in spaced relation, and a channel region is defined between the p-type body layer and the n-type drift layer. An n-type source layer is provided in the p-type body layer. In the n-type well, an n-type drain layer is provided in contact with the n-type drift layer. A gate electrode is provided in opposed relation to the channel region with the intervention of a gate insulation film.

With this arrangement, however, the n-type buried layer and the n-type drain layer are connected to the same node, so that a great capacitance present between the n-type buried layer and the p-type semiconductor substrate exerts a non-negligible influence on the through-rate. This makes it difficult to provide excellent switching characteristics. Since the p-type body layer is surrounded by the n-type well, a depletion layer cannot sufficiently laterally spread, making it impossible to reduce the ON resistance.

SUMMARY OF THE INVENTION

According to an embodiment of the present invention, there are provided an n-channel double diffusion MOS transistor having excellent switching characteristics, and a semiconductor composite device including the n-channel double diffusion MOS transistor.

The n-channel double diffusion MOS transistor according to the embodiment of the present invention includes: a p-type semiconductor substrate; a p-type epitaxial layer formed on the p-type semiconductor substrate through epitaxial growth; an n-type buried layer provided in a boundary between the p-type semiconductor substrate and the p-type epitaxial layer; a p-type body layer provided in a surface portion of the p-type epitaxial layer; an n-type source layer provided in the p-type body layer and defining a double diffusion structure together with the p-type body layer; an n-type drift layer provided in a surface portion of the p-type epitaxial layer in spaced relation from the p-type body layer to define a channel region between the n-type source layer and the n-type drift layer; an n-type drain layer provided in a surface portion of the p-type epitaxial layer in spaced relation from the channel region and in contact with the n-type drift layer; a p-type buried layer buried in the p-type epitaxial layer between the n-type drift layer and the n-type buried layer in contact with an upper surface of the n-type buried layer and having a lower impurity concentration than the n-type buried layer; a gate insulation film provided in a surface of the p-type epitaxial layer on the channel region; and a gate electrode provided in opposed relation to the channel region with the intervention of the gate insulation film.

Other elements, features, steps, characteristics and advantages of the present invention will become more apparent from the following detailed description of the preferred embodiments with reference to the attached drawings.

BRIEF DESCRIPTION OF THE DRAWINGS

FIGS. 2A and 2B are sectional views for explaining an exemplary structure of a CMOS area of the semiconductor composite device.

FIGS. 3A to 3C are sectional views for explaining an exemplary structure of a DMOS area of the semiconductor composite device.

FIGS. 4A to 4C are sectional views for explaining an exemplary structure of a bipolar area of the semiconductor composite device.

FIGS. 5A to 5C are sectional views for explaining an exemplary structure of a passive element area of the semiconductor composite device.

DETAILED DESCRIPTION OF PREFERRED EMBODIMENTS

Figure 1:
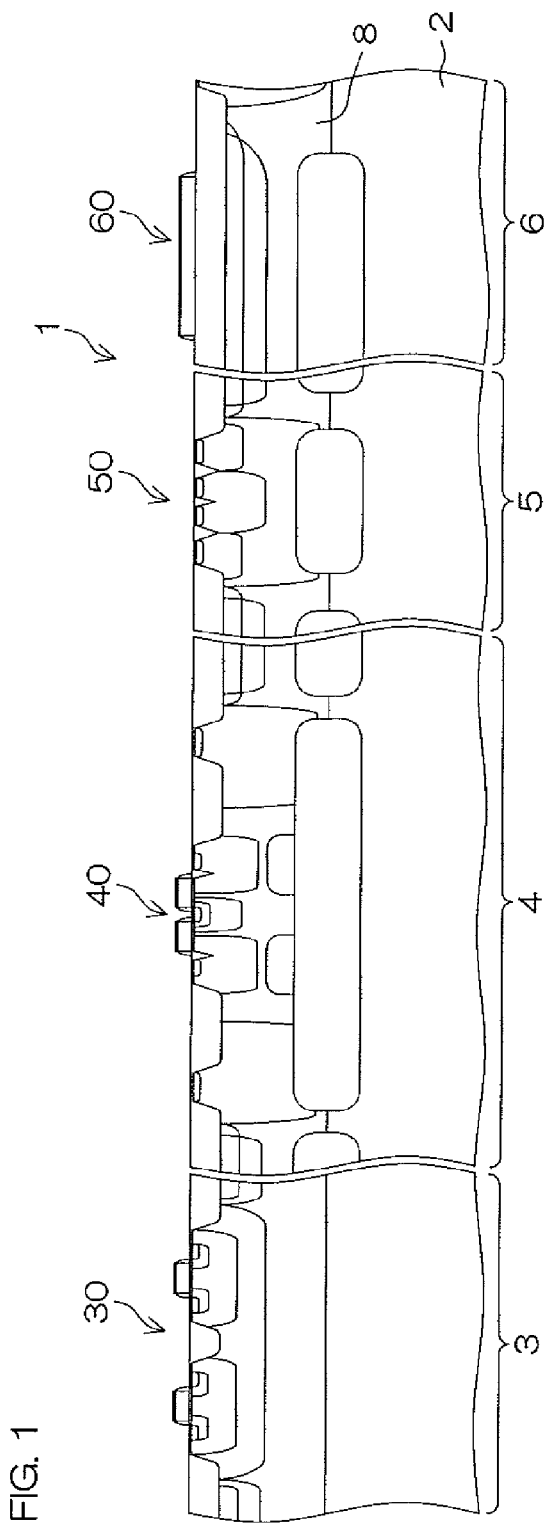
FIG. 1 is a sectional view for explaining the construction of a semiconductor composite device according to an embodiment of the present invention.

According to an embodiment of the present invention, there is provided an n-channel double diffusion MOS transistor, which includes: a p-type semiconductor substrate; a p-type epitaxial layer formed on the p-type semiconductor substrate through epitaxial growth; an n-type buried layer provided in a boundary between the p-type semiconductor substrate and the p-type epitaxial layer; a p-type body layer provided in a surface portion of the p-type epitaxial layer; an n-type source layer provided in the p-type body layer and defining a double diffusion structure together with the p-type body layer; an n-type drift layer provided in a surface portion of the p-type epitaxial layer in spaced relation from the p-type body layer to define a channel region between the n-type source layer and the n-type drift layer; an n-type drain layer provided in a surface portion of the p-type epitaxial layer in spaced relation from the channel region and in contact with the n-type drift layer; a p-type buried layer buried in the p-type epitaxial layer between the n-type drift layer and the n-type buried layer in contact with an upper surface of the n-type buried layer and having a lower impurity concentration than the n-type buried layer; a gate insulation film provided in a surface of the p-type epitaxial layer on the channel region; and a gate electrode provided in opposed relation to the channel region with the intervention of the gate insulation film.

With this arrangement, the p-type body layer and the n-type drift layer are provided in the p-type epitaxial layer. The p-type epitaxial layer is isolated from the p-type semiconductor substrate by the n-type buried layer, and the p-type buried layer is provided between the n-type buried layer and the n-type drift layer in contact with the n-type buried layer. Therefore, the n-type drain layer contacting the n-type drift layer is electrically isolated from the n-type buried layer, so that a great capacitance present between the n-type buried layer and the p-type semiconductor substrate is prevented from significantly influencing the switching characteristics.

Thus, the n-channel double diffusion MOS transistor is excellent in switching characteristics. Further, the p-type body layer is surrounded by the p-type epitaxial layer, and the p-type buried layer substantially prevents a depletion layer from spreading from the n-type drift layer toward the n-type buried layer. Therefore, the depletion layer can sufficiently laterally spread from the n-type drift layer. This reduces the ON resistance. Since the impurity concentration of the n-type buried layer is higher than the impurity concentration of the p-type buried layer (preferably, not less than 10 times the impurity concentration of the p-type buried layer), the n-type buried layer is unlikely to be converted into p-conductivity. This makes it possible to reliably isolate the p-type epitaxial layer from the p-type semiconductor substrate.

A breakdown voltage between the n-type drain layer and the n-type buried layer is comparable to a drain-source breakdown voltage. Further, a channel to be formed in the channel region in the p-type epitaxial layer reliably provides a source-drain current path.

On the other hand, the potential of the n-type source layer provided in the p-type body layer can be determined independently of the potential of the n-type buried layer. For example, it is possible to maintain the n-type source layer and the n-type drain layer at a higher potential level while maintaining the n-type buried layer at a ground potential level. Therefore, the n-channel double diffusion MOS transistor according to this embodiment can be employed as either of a high-side transistor and a low-side transistor of a bridge circuit (a full bridge circuit or a half bridge circuit) for use in an invertor circuit or a DC-DC convertor. That is, a common element structure can be employed for the high-side transistor and for the low-side transistor. This simplifies the element structure for the bridge circuit.

In an embodiment of the present invention, the n-type buried layer continuously extends through a region at least including regions present under the p-type body layer, the channel region, the n-type drift layer, the n-type source layer and the n-type drain layer. This reliably isolates an active region of the n-channel double diffusion MOS transistor from the p-type semiconductor substrate.

In an embodiment of the present invention, the p-type buried layer is provided in a region including the regions present under the n-type drift layer and the n-type drain layer. This substantially prevents the depletion layer from spreading from the n-type drift layer toward the n-type buried layer.

In an embodiment of the present invention, the p-type buried layer is absent from the region present under the p-type body layer. Thus, the p-type buried layer has a smaller size to thereby reduce the capacitance present between the n-type drift layer and the p-type buried layer. This further improves the switching characteristics.

In an embodiment of the present invention, the p-type buried layer is absent from the region present under the channel region. Thus, the p-type buried layer has a smaller size to thereby reduce the capacitance present between the n-type drift layer and the p-type buried layer. This further improves the switching characteristics.

In an embodiment of the present invention, an insulator buried structure is provided between the n-type drain layer and the channel region in the n-type drift layer to extend a current path in the n-type drift layer. With this arrangement, the insulator buried structure in the drift layer increases the length of the current path extending from the channel region to the n-type drain layer. This provides a drain extended structure, so that the n-channel double diffusion MOS transistor serves as a higher breakdown voltage element.

In an embodiment of the present invention, an n-type well is provided in contact with the n-type buried layer to surround the p-type body layer, the channel region, the n-type drift layer, the n-type source layer and the n-type drain layer to define an active region. With this arrangement, the active layer of the n-channel double diffusion MOS transistor can be laterally isolated. Therefore, a semiconductor device of a composite type can be provided by forming different types of elements on the common semiconductor substrate. Since the n-type well and the n-type buried layer are connected to the same node, the potential of the n-type buried layer can be controlled by controlling the potential of the n-type well (e.g., at a ground potential level). This ensures stable device operation.

In an embodiment of the present invention, there is provided a semiconductor composite device, which includes: an n-channel double diffusion MOS transistor having the aforementioned features; a CMOS element provided on the p-type semiconductor substrate; and a bipolar element provided on the p-type semiconductor substrate. This arrangement provides a BiCDMOS device including the n-channel double diffusion MOS transistor excellent in switching characteristics.

The semiconductor composite device may include at least one of functional elements (an active element or a passive element) typified by a p-channel DMOS transistor, a p-channel MOS transistor, an n-channel MOS transistor, a resistor element, a capacitor element and a diode element.

The present invention will hereinafter be described more specifically by way of an example with reference to the attached drawings.

FIG. 1 is a sectional view for explaining the construction of an semiconductor composite device according to an embodiment of the present invention. The semiconductor composite device 1 is a BiCDMOS device, which includes a CMOS area 3, a DMOS area 4, a bipolar area 5 and a passive element area 6 provided on a common semiconductor substrate 2 (e.g., silicon substrate). CMOS transistors 30 are provided in the CMOS area 3, and DMOS transistors 40 are provided in the DMOS area 4. Bipolar elements 50 are provided in the bipolar area 5. Passive elements 60 such as a resistor element and a capacitor are provided in the passive element area 6.

Figure 2B:
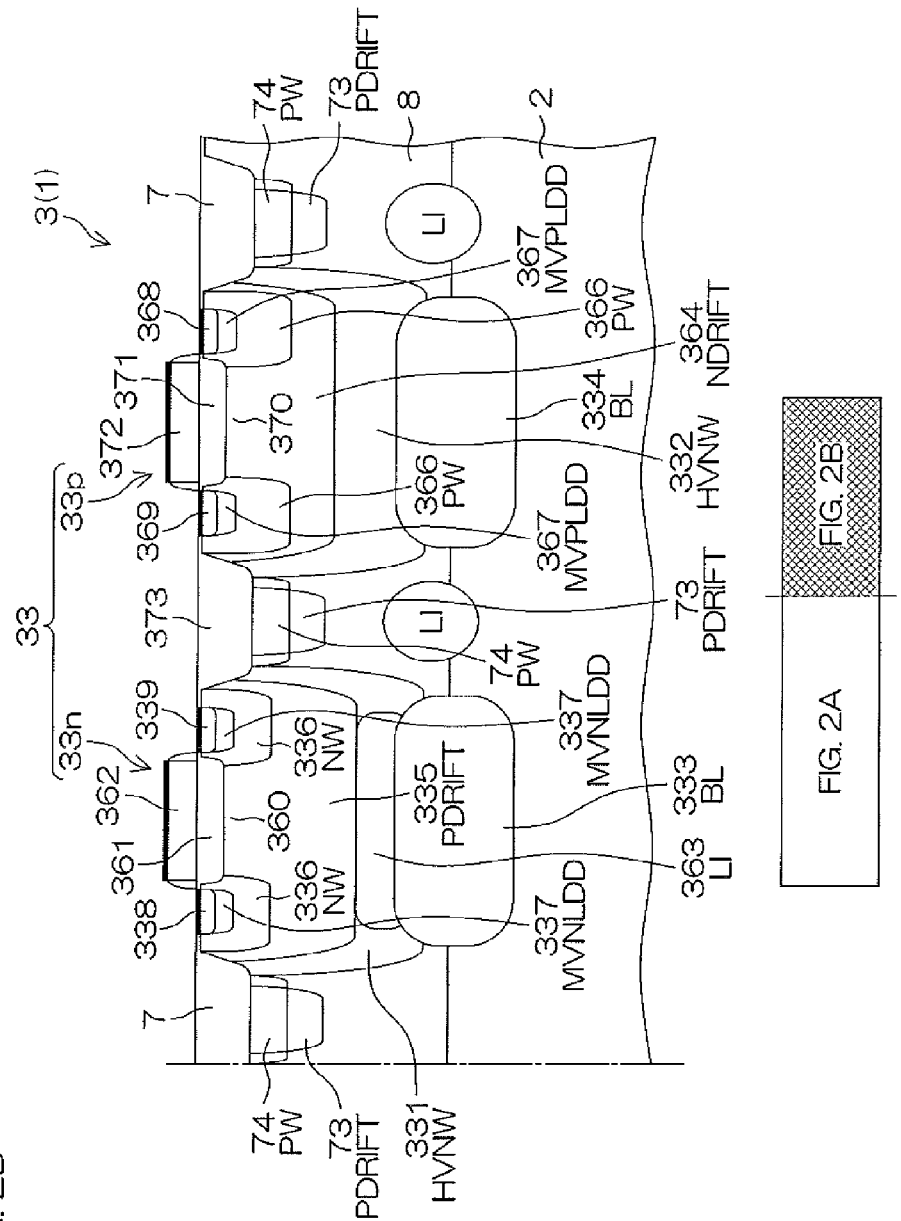

FIGS. 2A and 2B are sectional views for explaining an exemplary structure of the CMOS area 3. FIGS. 2A and 2B are combined together as shown in lower portions thereof to provide a sectional view of the CMOS area 3. In the CMOS area 3, a lower breakdown voltage CMOS transistor 31 having a breakdown voltage of about 1.5 V, a medium breakdown voltage CMOS transistor 32 having a breakdown voltage of about 5 V and a higher breakdown voltage CMOS transistor 33 having a breakdown voltage of about 15 V, for example, are provided as the CMOS transistors 30. The lower breakdown voltage CMOS transistor 31 includes a lower breakdown voltage n-channel MOS transistor 31n and a lower breakdown voltage p-channel MOS transistor 31p. The medium breakdown voltage CMOS transistor 32 includes a medium breakdown voltage n-channel MOS transistor 32n and a medium breakdown voltage p-channel MOS transistor 32p. The higher breakdown voltage CMOS transistor 33 includes a higher breakdown voltage n-channel MOS transistor 33n and a higher breakdown voltage p-channel MOS transistor 33p. These MOS transistors are electrically isolated from each other by isolation portions 7. In this embodiment, the isolation portions 7 each have an STI (Shallow Trench Isolation) structure which is formed by embedding an insulator 72 (e.g., silicon oxide) in a trench 71.

A p-type epitaxial layer 8 formed through epitaxial growth is provided on the p-type semiconductor substrate 2. A deep n-type well 311 (DNW) for the lower breakdown voltage CMOS transistor is provided in a surface portion of the p-type epitaxial layer 8. The lower breakdown voltage n-channel MOS transistor 31n and the lower breakdown voltage p-channel MOS transistor 31p are provided in the n-type well 311. More specifically, a shallow p-type well 312 (PW) and a shallow n-type well 313 (NW) are provided in a surface portion of the n-type well 311. An isolation portion 346 (7) isolates the p-type well 312 and the n-type well 313 from each other. A pair of n-type LDD (Lightly Doped Drain) layers 314 (LVPLDD) are provided in spaced relation in a surface portion of the p-type well 312. An $n^+$-type source layer 315 and an $n^+$-type drain layer 316 are respectively provided in the pair of n-type LDD layers 314. A channel region 317 is defined between the pair of n-type LDD layers 314. A gate electrode 319 is opposed to the channel region 317 with the intervention of a gate insulation film 318. Thus, the lower breakdown voltage n-channel MOS transistor 31n is provided. On the other hand, a pair of p-type LDD layers 340 (LVPLDD) are provided in spaced relation in a surface portion of the n-type well 313. A $p^+$-type source layer 341 and a $p^+$-type drain layer 342 are respectively provided in the pair of p-type LDD layers 340. A channel region 343 is defined between the pair of p-type LDD layers 340. A gate electrode 345 is opposed to the channel region 343 with the intervention of a gate insulation film 344. Thus, the lower breakdown voltage p-channel MOS transistor 31p is provided.

A deep n-type well 321 (HVNW) for the medium breakdown voltage n-channel MOS transistor 32n and a deep n-type well 322 (HVNW) for the medium breakdown voltage p-channel MOS transistor 32p are provided in a surface portion of the p-type epitaxial layer 8. These n-type wells 321, 322 are isolated from each other by an isolation portion 357 (7). The medium breakdown voltage n-channel MOS transistor 32n and the medium breakdown voltage p-channel MOS transistor 32p are respectively provided in the n-type wells 321, 322. More specifically, a shallow p-type well 323 (PW) is provided in a surface portion of the n-type well 321. A pair of n-type LDD layers 324 (MVNLDD) are provided in spaced relation in a surface portion of the p-type well 323. An $n^+$-type source layer 325 and an $n^+$-type drain layer 326 are respectively provided in the pair of n-type LDD layers 324. A channel region 327 is defined between the pair of n-type LDD layers 324. A gate electrode 329 is opposed to the channel region 327 with the intervention of a gate insulation film 328. Thus, the medium breakdown voltage n-channel MOS transistor 32n is provided. On the other hand, a shallow n-type well 350 (NW) is provided in a surface portion of the deep n-type well 322. A pair of p-type LDD layers 351 (MVPLDD) are provided in spaced relation in a surface portion of the n-type well 350. A $p^+$-type source layer 352 and a $p^+$-type drain layer 353 are respectively provided in the pair of p-type LDD layers 351. A channel region 354 is defined between the pair of p-type LDD layers 351. A gate electrode 356 is opposed to the channel region 354 with the intervention of a gate insulation film 355. Thus, the medium breakdown voltage p-channel MOS transistor 32p is provided.

A deep n-type well 331 (HVNW) for the higher breakdown voltage n-channel MOS transistor 33n and a deep n-type well 332 (HVNW) for the higher breakdown voltage p-channel MOS transistor 33p are provided in a surface portion of the p-type epitaxial layer 8. These n-type wells 331, 332 are isolated from each other by an isolation portion 373 (7). Further, n-type buried layers 333, 334 (BL) are respectively provided at the bottoms of the n-type wells 331, 332, thereby electrically isolating the n-type wells 331, 332 from the p-type semiconductor substrate 2.

The higher breakdown voltage n-channel MOS transistor 33n and the higher breakdown voltage p-channel MOS transistor 33p are respectively provided in the n-type wells 331, 332.

More specifically, a p-type drift layer 335 (PDRIFT) is provided in the n-type well 331. A pair of shallow n-type wells 336 (NW) are provided in spaced relation in a surface portion of the p-type drift layer 335. A pair of n-type LDD layers 337 (MVNLDD) are provided in the pair of shallow n-type wells 336, respectively. An $n^+$-type source layer 338 and an $n^+$-type drain layer 339 are respectively provided in the pair of n-type LDD layers 337. A channel region 360 is defined between the pair of shallow n-type wells 336. A gate electrode 362 is opposed to the channel region 360 with the intervention of a gate insulation film 361. Thus, the higher breakdown voltage n-channel MOS transistor 33n is provided. A p-type buried layer 363 (LI) is provided between the p-type drift layer 335 and the n-type buried layer 333. Upper and lower surfaces of the p-type buried layer 363 contact the p-type drift layer 335 and the n-type buried layer 333, respectively.

On the other hand, an n-type drift layer 364 (NDRIFT) is provided in the deep n-type well 332. A pair of shallow p-type wells 366 (PW) are provided in spaced relation in a surface portion of the n-type drift layer 364. A pair of p-type LDD layers 367 (MVPLDD) are provided in the pair of shallow p-type wells 366, respectively. A $p^+$-type source layer 368 and a $p^+$-type drain layer 369 are respectively provided in the pair of p-type LDD layers 367. A channel region 370 is defined between the pair of shallow p-type wells 366. A gate electrode 372 is opposed to the channel region 370 with the intervention of a gate insulation film 371. Thus, the higher breakdown voltage p-channel MOS transistor 33p is provided.

Isolation portions 7 provided around the deep n-type wells 321, 322, 331, 332 are each associated with a p-type drift layer 73 (PDRIFT) and a p-type well 74 (PW) provided at the bottom thereof. Thus, the isolation of the elements can be more reliably achieved.

Figure 3A:
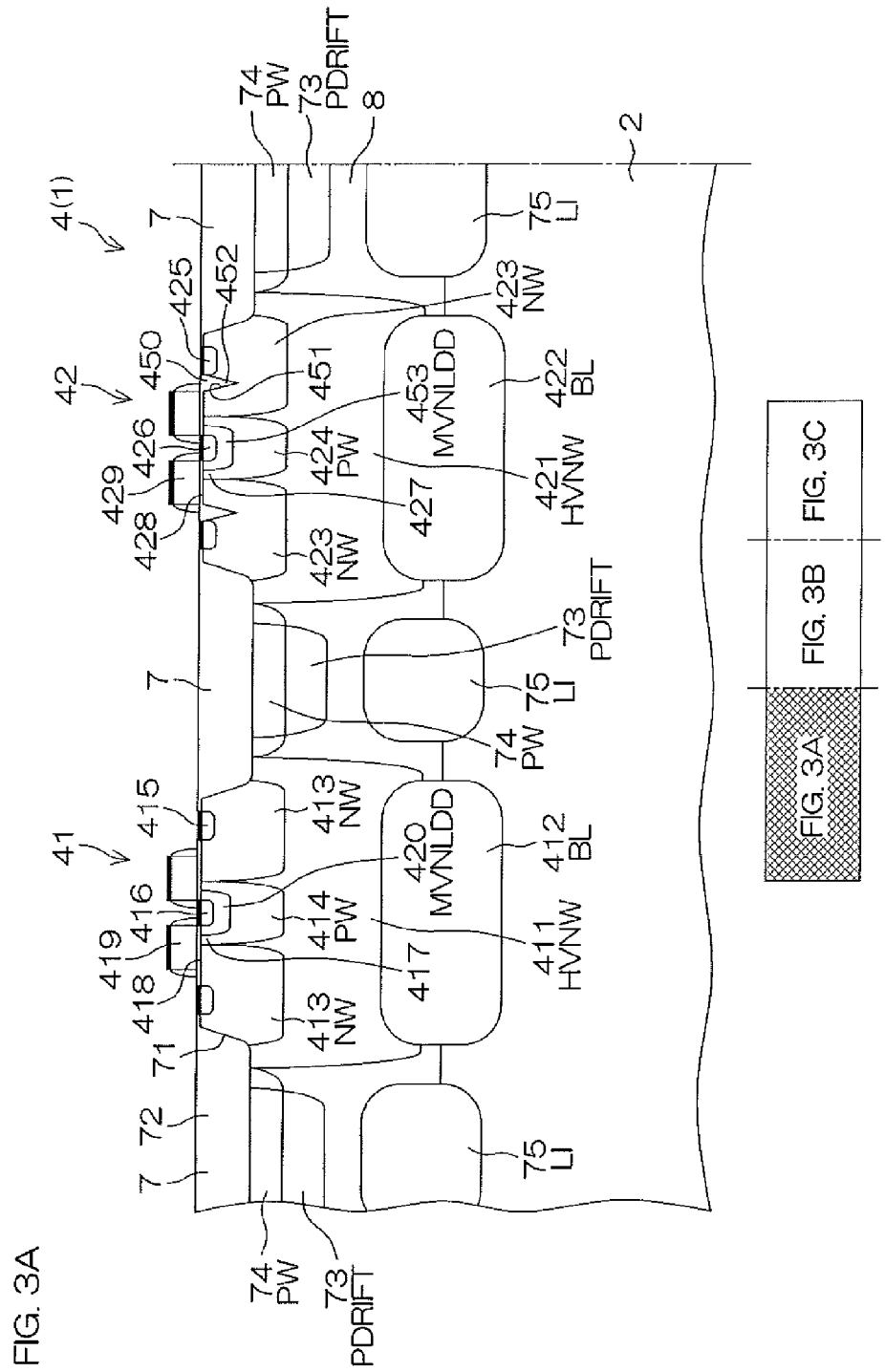
Figure 3C:
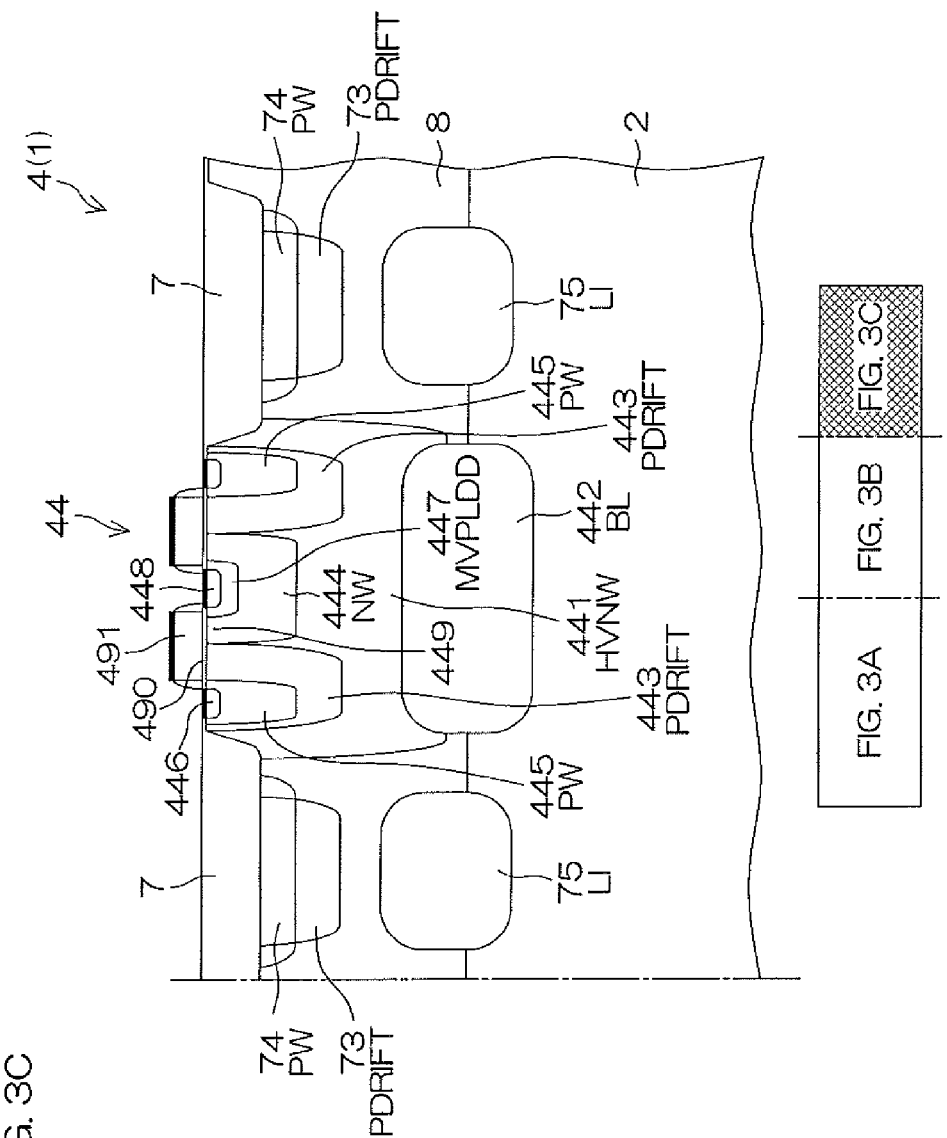

FIGS. 3A, 3B and 3C are sectional views for explaining an exemplary structure of the DMOS area 4. FIGS. 3A, 3B and 3C are combined together as shown in lower portions thereof to provide a sectional view of the DMOS area 4. In the DMOS area 4, a lower breakdown voltage n-channel DMOS transistor 41 having a breakdown voltage of about 7 V, a medium breakdown voltage n-channel DMOS transistor 42 having a breakdown voltage of about 10 V, a higher breakdown voltage n-channel DMOS transistor 43 having a breakdown voltage of about 15 V to about 28 V and a higher breakdown voltage p-channel DMOS transistor 44 having a breakdown voltage of about 10 V to about 28 V, for example, are provided as the DMOS transistors 40. The higher breakdown voltage n-channel DMOS transistor 43 is the n-channel double diffusion MOS transistor according to an embodiment of the present invention. These DMOS transistors 41 to 44 are electrically isolated from each other by isolation portions 7. In this embodiment, the isolation portions 7 in the DMOS area 4 each have an STI structure formed by embedding an insulator 72 (e.g., silicon oxide) in a trench 71. The isolation portions 7 are each associated with a p-type drift layer 73 (PDRIFT) and a p-type well 74 (PW) provided at the bottom thereof. Thus, the isolation of the elements can be reliably achieved. Further, a p-type buried layer 75 (LI) is provided under each of the isolation portions 7 in the DMOS area 4. The p-type buried layer 75 is disposed in a boundary between the p-type semiconductor substrate 2 and the p-type epitaxial layer 8.

A deep n-type well 411 (HVNW) for the lower breakdown voltage n-channel DMOS transistor 41 is provided in a surface portion of the p-type epitaxial layer 8 formed on the p-type semiconductor substrate 2 through epitaxial growth. The lower breakdown voltage n-channel DMOS transistor 41 is provided in the n-type well 411. An n-type buried layer 412 (BL) is provided at the bottom of the n-type well 411 to electrically isolate the n-type well 411 from the p-type semiconductor substrate 2.

An annular shallow n-type well 413 (NW) serving as an n-type drift layer is provided in a surface portion of the n-type well 411, and a shallow p-type well 414 (PW) serving as a p-type body layer is surrounded by the n-type well 413. An $n^+$-type drain layer 415 is provided in a surface portion of the n-type well 413. An n-type LDD layer 420 (MVNLDD) is provided in a surface portion of the p-type well 414, and an $n^+$-type source layer 416 is provided in a surface portion of the n-type LDD layer 420. A channel region 417 is defined between the $n^+$-type drain layer 415 and the $n^+$-type source layer 416. A gate electrode 419 is opposed to the channel region 417 with the intervention of a gate insulation film 418. In this embodiment, the gate electrode 419 has an annular shape fitted along an inner periphery of the annular n-type well 413. Thus, the lower breakdown voltage n-channel DMOS transistor 41 is provided as having a double diffusion structure in which the $n^+$-type source layer 416 is provided in the p-type well 414.

A deep n-type well 421 (HVNW) for the medium breakdown voltage n-channel DMOS transistor 42 is provided in a surface portion of the p-type epitaxial layer 8. The medium breakdown voltage n-channel DMOS transistor 42 is provided in the n-type well 421. An n-type buried layer 422 (BL) is provided at the bottom of the n-type well 421 to electrically isolate the n-type well 421 from the p-type semiconductor substrate 2.

An annular shallow n-type well 423 (NW) serving as an n-type drift layer is provided in a surface portion of the n-type well 421, and a shallow p-type well 424 (PW) serving as a p-type body layer is surrounded by the n-type well 423. An $n^+$-type drain layer 425 is provided in a surface portion of the shallow n-type well 423. An n-type LDD layer 453 (MVNLDD) is provided in a surface portion of the shallow p-type well 424. An $n^+$-type source layer 426 is provided in a surface portion of the n-type LDD layer 453. A channel region 427 is defined between the $n^+$-type drain layer 425 and the $n^+$-type source layer 426. A gate electrode 429 is opposed to the channel region 427 with the intervention of a gate insulation film 428. In this embodiment, the gate electrode 429 has an annular shape fitted along an inner periphery of the annular n-type well 423. Thus, the medium breakdown voltage n-channel DMOS transistor 42 is provided as having a double diffusion structure in which the $n^+$-type source layer 426 is provided in the p-type well 424. In a surface portion of the shallow n-type well 423, an annular STI structure 450 serving as an insulator buried structure is provided along an outer periphery of the gate electrode 429. The STI structure 450 is formed by embedding an insulator 452 such as silicon oxide in a trench 451 formed by digging the n-type well 423 from the surface of the n-type well 423. The STI structure 450 extends a current path in the n-type well 423 serving as the drift layer, thereby increasing the breakdown voltage.

The higher breakdown voltage n-channel DMOS transistor 43 has an active region 432 provided in a region (of the p-type epitaxial layer 8) surrounded by an annular n-type well 431 (HVNW) provided in a surface portion of the p-type epitaxial layer 8 (PEPI). The active region 432 is further defined by an n-type buried layer 433 (BL) at its bottom. The n-type buried layer 433 is disposed in the boundary between the p-type semiconductor substrate 2 and the p-type epitaxial layer 8. The n-type well 431 extends from the surface of the p-type epitaxial layer 8 to the n-type buried layer 433 with its lower portion in contact with an upper surface of the n-type buried layer 433. Thus, the active region 432 is electrically isolated from the p-type semiconductor substrate 2 and a portion of the p-type epitaxial layer 8 outside the region 432. An $n^+$-type layer 466 serving as an electrode connection portion for controlling the potential of the n-type well 431 is provided in a surface portion of the n-type well 431.

An annular n-type drift layer 435 (NDRIFT) is provided in the active region 432 in a surface portion of the p-type epitaxial layer 8. A shallow p-type well 436 (PW) serving as a p-type body layer is surrounded by the n-type drift layer 435. An $n^+$-type drain layer 438 is provided in a surface portion of the n-type drift layer 435. An n-type LDD layer 437 (MVNLDD) is provided in a surface portion of the p-type well 436, and an $n^+$-type source layer 439 is provided in a surface portion of the n-type LDD layer 437. A channel region 460 is defined between the n-type drift layer 435 and the $n^+$-type source layer 439. The $n^+$-type drain layer 438 is disposed in spaced relation from the channel region 460 and in contact with the n-type drift layer 435. In this embodiment, the $n^+$-type drain layer 438 is disposed within the n-type drift layer 435. However, the $n^+$-type drain layer 438 is merely required to contact the n-type drift layer 435 and, therefore, may be partly located outside the n-type drift layer 435. A gate electrode 462 is opposed to the channel region 460 with the intervention of a gate insulation film 461. In this embodiment, the gate electrode 462 has an annular shape fitted along an inner periphery of the annular n-type drift layer 435. Thus, the higher breakdown voltage n-channel DMOS transistor 43 is provided as having a double diffusion structure in which the $n^+$-type source layer 439 is provided in the p-type well 436.

An annular insulator buried structure is provided as an STI structure 463 which extends along an outer periphery of the gate electrode 462 in a surface portion of the n-type drift layer 435. The STI structure 463 is formed by embedding an insulator 465 such as silicon oxide in a trench 464 formed by digging the n-type drift layer 435 from the surface of the n-type drift layer 435. The STI structure 463 extends a current path in the n-type drift layer 435 to thereby provide a drain extended structure. This increases the breakdown voltage.

An STI portion 456 is provided in a surface of the p-type epitaxial layer 8 between the $n^+$-type well 431 and the n-type drift layer 435.

A p-type buried layer 434 (LI) is provided between the n-type drift layer 435 and the n-type buried layer 433. The p-type buried layer 434 contacts the upper surface of the n-type buried layer 433. An upper surface of the p-type buried layer 434 is spaced from the n-type drift layer 435, and the p-type epitaxial layer 8 is partly present between the p-type buried layer 434 and the n-type drift layer 435. The impurity concentration of the p-type buried layer 434 is lower than the impurity concentration of the n-type buried layer 433 and is, for example, not greater than one tenth the impurity concentration of the n-type buried layer 433.

The n-type buried layer 433 continuously extends through a region including regions present under the p-type well 431, the channel region 460, the n-type drift layer 435, the $n^+$-type source layer 439 and the $n^+$-type drain layer 438. The p-type buried layer 434 is disposed in a region present under the n-type drift layer 435 and the $n^+$-type drain layer 438. The p-type buried layer 434 is absent from the region present under the p-type well 436 and the channel region 460.

Thus, the p-type well 436 serving as the p-type body layer and the n-type drift layer 435 are disposed in the p-type epitaxial layer 8. The p-type epitaxial layer 8 is isolated from the p-type semiconductor substrate 2 by the n-type buried layer 433, and the p-type buried layer 434 is provided between the n-type buried layer 433 and the n-type drift layer 435 in contact with the n-type buried layer 433. Therefore, the n+-type drain layer 438 contacting the n-type drift layer 435 is electrically isolated from the n-type buried layer 433, so that a greater capacitance present between the n-type buried layer 435 and the p-type semiconductor substrate 2 is prevented from significantly influencing the switching characteristics, thereby ensuring excellent switching characteristics. Further, the p-type well 436 is surrounded by the p-type epitaxial layer 8 and, in addition, the p-type buried layer 434 substantially prevents a depletion layer from spreading from the n-type drift layer 435 toward the n-type buried layer 433. Therefore, the depletion layer can sufficiently laterally spread from the n-type drift layer 435. This reduces the ON resistance. Since the impurity concentration of the n-type buried layer 433 is higher than the impurity concentration of the p-type buried layer 434 (preferably not less than 10 times the impurity concentration of the p-type buried layer 434), the n-type buried layer 433 is unlikely to be converted into p-conductivity. This makes it possible to reliably isolate the p-type epitaxial layer 8 from the p-type semiconductor substrate 2.

A breakdown voltage between the n+-type drain layer 438 and the n-type buried layer 433 is comparable to a source-drain breakdown voltage. Further, a channel to be formed in the channel region 460 in the p-type epitaxial layer 8 can reliably provide a source-drain current path.

On the other hand, the potential of the n+-type source layer 439 provided in the p-type well 436 can be determined independently of the potential of the n-type buried layer 433. For example, it is possible to maintain the n+-type source layer 439 and the n+-type drain layer 438 at a higher potential level while maintaining the n-type buried layer 433 at a ground potential level. Therefore, the higher breakdown voltage n-channel DMOS transistor 43 can be employed as either of a high-side transistor and a low-side transistor of a bridge circuit (a full bridge circuit or a half bridge circuit) for use in an invertor circuit or a DC-DC convertor. That is, common element structures can be employed for the high-side transistor and for the low-side transistor. This simplifies the element structures for the bridge circuit.

In this embodiment, the n-type buried layer 433 continuously extends through the region including the regions present under the p-type well 436, the channel region 460, the n-type drift layer 435, the n+-type source layer 439 and the n+-type drain layer 438. This makes it possible to reliably isolate the active region 432 from the p-type semiconductor substrate 2.

In this embodiment, the p-type buried layer 434 is provided in the region including the regions present under the n-type drift layer 435 and the n+-type drain layer 438. This substantially prevents the depletion layer from spreading from the n-type drift layer 435 toward the n-type buried layer 433.

In this embodiment, the p-type buried layer 434 is absent from the region present under the p-type well 436. Further, the p-type buried layer 434 is absent from the region present under the channel region 460. Thus, the p-type buried layer 434 has a smaller size to thereby reduce the capacitance present between the n-type drift layer 435 and the p-type buried layer 434. This further improves the switching characteristics.

In this embodiment, the n-type well 431 surrounds the p-type well 436, the channel region 460, the n-type drift layer 435, the n+-type source layer 439 and the n+-type drain layer 438 to define the active region 432, and contacts the n-type buried layer 433. Thus, the active region 432 can be laterally isolated. Therefore, the composite semiconductor device can be provided by forming other elements on the common p-type semiconductor substrate 2. Further, the n-type well 431 and the n-type buried layer 433 are connected to the same node, so that the potential of the n-type buried layer 433 can be controlled by controlling the potential of the n-type well 431 (e.g., at a ground potential level). This ensures stable device operation.

A deep n-type well 441 (HVNW) for the higher breakdown voltage p-channel DMOS transistor 44 is provided in a surface portion of the p-type epitaxial layer 8. The higher breakdown voltage p-channel DMOS transistor 44 is provided in the deep n-type well 441. An n-type buried layer 442 (BL) is provided at the bottom of the n-type well 441 to electrically isolate the n-type well 441 from the p-type semiconductor substrate 2.

An annular p-type drift layer 443 (PDRIFT) is provided in a surface portion of the n-type well 441, and a shallow n-type well 444 (NW) serving as an n-type body layer is surrounded by the p-type drift layer 443. An annular shallow p-type well 445 (PW) is provided in the p-type drift layer 443. An annular p+-type drain layer 446 is provided in a surface portion of the p-type well 445. Further, a p-type LDD layer 447 (MVPLDD) is provided in a surface portion of the n-type well 444, and a p+-type source layer 448 is provided in a surface portion of the p-type LDD layer 447. A channel region 449 is defined between the p+-type drain layer 446 and the p+-type source layer 448. A gate electrode 491 is opposed to the channel region 449 with the intervention of a gate insulation film 490. In this embodiment, the gate electrode 491 has an annular shape fitted along an inner periphery of the annular p-type drift layer 443. Thus, the higher breakdown voltage p-channel DMOS transistor 44 is provided as having a double diffusion structure in which the p+-type source layer 448 is provided in the n-type well 444.

Figure 4A:
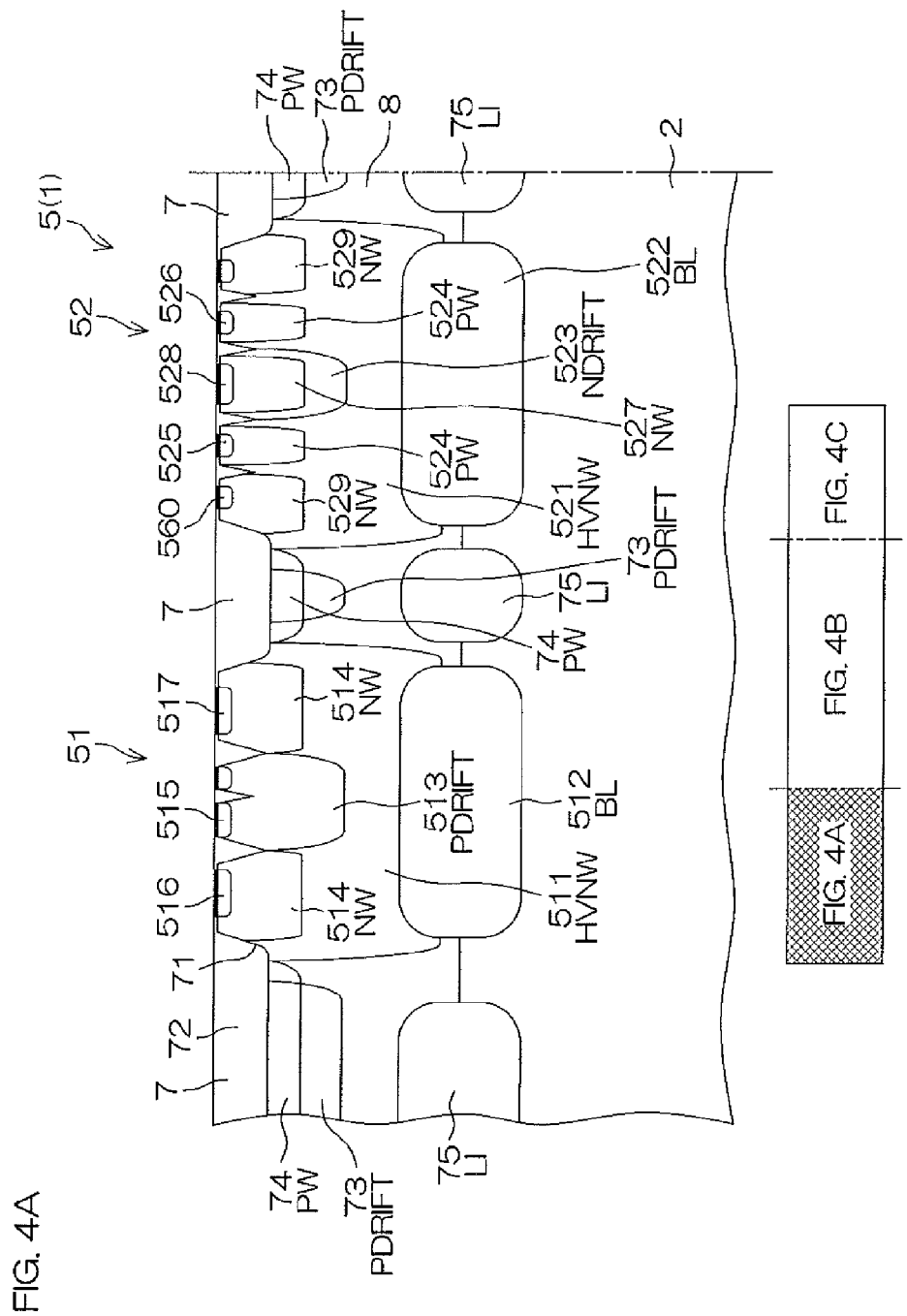

FIGS. 4A, 4B and 4C are sectional views for explaining an exemplary structure of the bipolar area 5. FIGS. 4A, 4B and 4C are combined together as shown in lower portions thereof to provide a sectional view of the bipolar area 5. An npn transistor 51 having a breakdown voltage of about 10 V, a pnp transistor 52 having a breakdown voltage of about 10 V, an ESD (Electrostatic Discharge) diode 53 having a breakdown voltage of about 10 V to about 15 V, a Zener diode 54 having a breakdown voltage of about 7V and a p-channel body diode 55 having a breakdown voltage of about 16 V to about 38 V, for example, are provided as the bipolar elements 50 in the bipolar area 5. These elements 51 to 55 are electrically isolated from each other by isolation portions 7. In this embodiment, the isolation portions 7 in the bipolar area 5 each have an STI structure formed by embedding an insulator 72 (e.g., silicon oxide) in a trench 71. The isolation portions 7 are each associated with a p-type drift layer 73 (PDRIFT) and a p-type well 74 (PW) provided at the bottom thereof. Thus, the isolation of the elements can be more reliably achieved. A p-type buried layer 75 (LI) is provided under each of the isolation portions 7 in the bipolar area 5. The p-type buried layer 75 is disposed in the boundary between the p-type semiconductor substrate 2 and the p-type epitaxial layer 8.

A deep n-type well 511 (HVNW) for the npn transistor 51 is provided in the p-type epitaxial layer 8. An n-type buried layer 512 (BL) is provided at the bottom of the n-type well 511 to electrically isolate the n-type well 511 from the p-type semiconductor substrate 2.

A p-type drift layer 513 (PDRIFT) is provided in a surface portion of the n-type well 511, and a pair of shallow n-type wells 514 (NW) are provided in opposed relation on opposite sides of the p-type drift layer 513. A p+-type base layer 515 is provided in a surface portion of the p-type drift layer 513. An n+-type collector layer 516 and an n+-type emitter layer 517 are respectively provided in surface portions of the pair of shallow n-type wells 514.

Further, a deep n-type well 521 (HVNW) for the pnp transistor 52 is provided in the p-type epitaxial layer 8. An n-type buried layer 522 (BL) is provided at the bottom of the n-type well 521 to electrically isolate the n-type well 521 from the p-type semiconductor substrate 2.

An n-type drift layer 523 (NDRIFT) is provided in a surface portion of the n-type well 521, and a pair of shallow p-type wells 524 (PW) are provided in opposed relation on opposite sides of the n-type drift layer 523. A p+-type collector layer 525 and a p+-type emitter layer 526 are respectively provided in surface portions of the pair of p-type wells 524. Further, a shallow n-type well 527 (PW) is provided in the n-type drift layer 523, and a p+-type base layer 528 is provided in a surface portion of the n-type well 527. A shallow n-type well 529 (NW) is provided along an inner edge of the deep n-type well 521 outside the pair of collector/emitter p-type wells 524 in the deep n-type well 521. An n+-type layer 560 for controlling the potential of the deep n-type well 521 is provided in a surface portion of the shallow n-type well 529.

Further, a deep n-type well 531 (HVNW) for the ESD diode 53 is provided in the p-type epitaxial layer 8. An n-type buried layer 532 (BL) is provided at the bottom of the n-type well 531 to electrically isolate the n-type well 531 from the p-type semiconductor substrate 2.

An n-type drift layer 533 (NDRIFT) is provided in a surface portion of the n-type well 531. A plurality of n-type LDD layers 535 (MVNLDD) are provided in spaced relation in a surface portion of the n-type drift layer 533, and a plurality of p-type LDD layers 534 are provided between the n-type LDD layers 535 (MVNLDD). STI structures 536 are provided between the p-type LDD layers 534 and the n-type LDD layers 535. A p+-type anode layer 537 is provided in a surface portion of each of the p-type LDD layers 534, and an n+-type cathode layer 538 is provided in a surface portion of each of the n-type LDD layer 535.

Further, a deep n-type well 541 (HVNW) for the Zener diode 54 is provided in the p-type epitaxial layer 8. An n-type buried layer 542 (BL) is provided at the bottom of the n-type well 541 to electrically isolate the n-type well 541 from the p-type semiconductor substrate 2. The Zener diode 54 is connected, for example, between the emitter and the base of the npn transistor 51.

A p-type drift layer 543 (PDRIFT) is provided in a surface portion of the n-type well 541. A shallow p-type well 544 (PW) is provided in a surface portion of the p-type drift layer 543. Further, a plurality of p-type LDD layers 545 (MVNLDD) are provided in spaced relation in a surface portion of the p-type well 544, and a plurality of n-type LDD layers 546 (MVNLDD) are provided between the p-type LDD layers 545. A p+-type anode layer 547 is provided in a surface portion of each of the p-type LDD layers 545, and an n+-type layer 548 is provided in a surface portion of each of the n-type LDD layers 546. Further, n-type LDD layers 549 (MVNLDD) are provided outward of the p-type drift layers 545 in surface portions of the deep n-type well 541. An n+-type cathode layer 570 is provided in a surface portion of each of the n-type LDD layers 549.

Further, a deep n-type well 551 (HVNW) for the p-channel body diode 55 is provided in a surface portion of the p-type epitaxial layer 8. The p-channel body diode 55 is provided in the n-type well 551. An n-type buried layer 552 (BL) is provided at the bottom of the n-type well 551 to electrically isolate the n-type well 551 from the p-type semiconductor substrate 2.

An annular p-type drift layer 553 (PDRIFT) is provided in a surface portion of the n-type well 551, and a shallow n-type well 554 (NW) serving as an n-type body layer is surrounded by the p-type drift layer 553. An annular shallow p-type well 555 (PW) is provided in the p-type drift layer 553. An annular p+-type drain layer 556 is provided in a surface portion of the p-type well 555. Further, a p-type LDD layer 557 (MVPLDD) is provided in a surface portion of the n-type well 554, and a p+-type source layer 558 is provided in a surface portion of the p-type LDD layer 557. A channel region 559 is defined between the p+-type drain layer 556 and the p+-type source layer 558. A gate electrode 581 is opposed to the channel region 559 with the intervention of a gate insulation film 580. In this embodiment, the gate electrode 581 has an annular shape extending along an inner periphery of the annular p-type drift layer 553. Thus, a MOS transistor structure is provided, in which a pn junction diode (body diode) is incorporated between the p-type drift layer 553 and the n-type well 554.

Figure 5B:
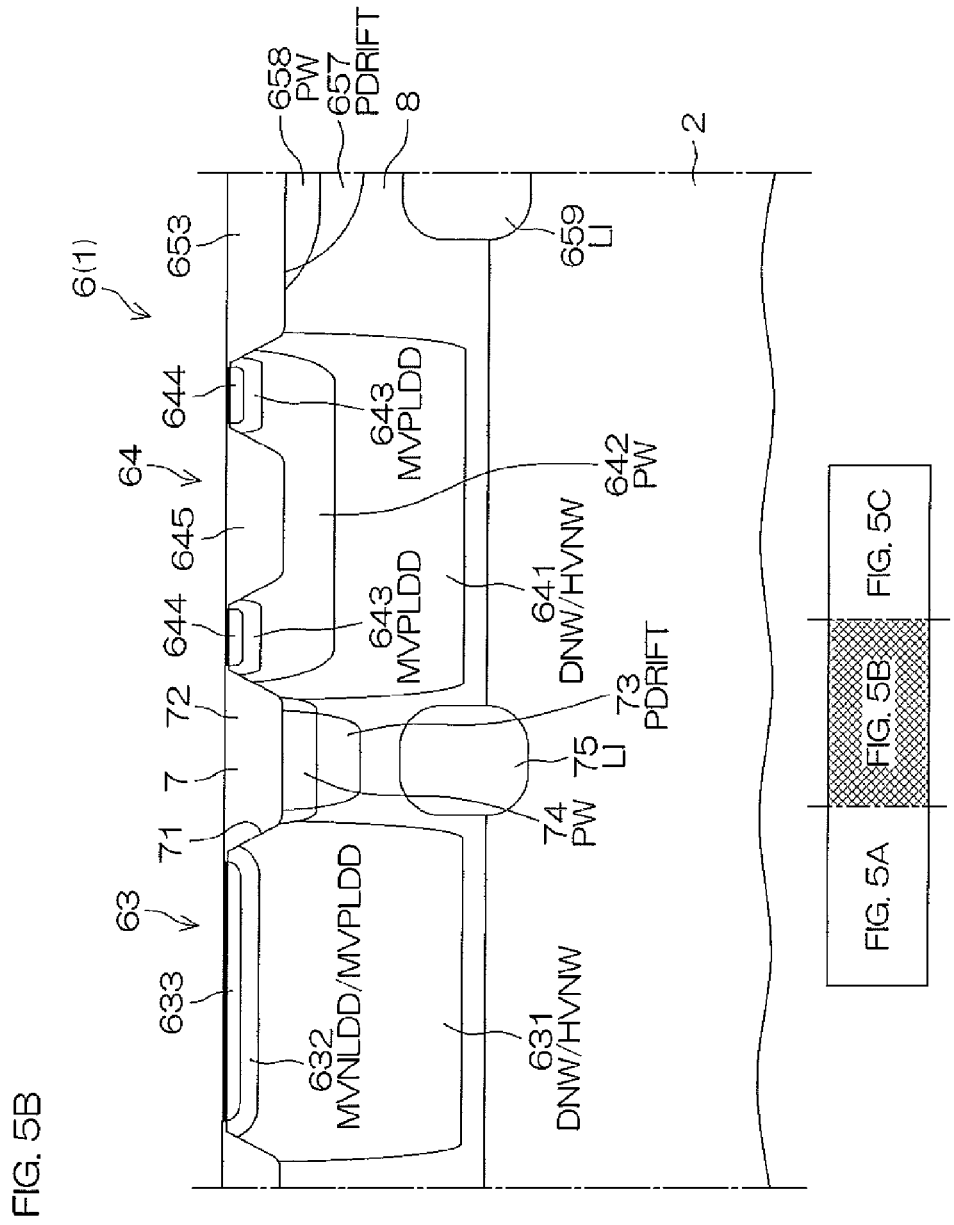

FIGS. 5A, 5B and 5C are sectional views for explaining an exemplary structure of the passive element area 6. FIGS. 5A, 5B and 5C are combined together as shown in lower portions thereof to provide a sectional view of the passive element area 6. A higher resistance polysilicon resistor element 61, an n+/p+ polysilicon resistor element 62, an active resistor element 63, a p-type well resistor element 64 and an MIM (Metal-Insulator-Metal) capacitor element 65, for example, are provided as the passive elements 60 in the passive element area 6. Isolation portions 7 are provided between the active resistor element 63 and the p-type well resistor element 64, i.e., between the elements formed in the epitaxial layer 8. In this embodiment, the isolation portions 7 each have an STI structure formed by embedding an insulator 72 (e.g., silicon oxide) in a trench 71. The isolation portions 7 are each associated with a p-type drift layer 73 (PDRIFT) and a p-type well 74 (PW) provided at the bottom thereof. Thus, the isolation of the elements can be more reliably achieved. A p-type buried layer 75 (LI) is provided under each of the isolation portions 7. The p-type buried layer 75 is disposed in the boundary between the p-type semiconductor substrate 2 and the p-type epitaxial layer 8.

The higher resistance polysilicon resistor element 61 is provided on a surface of an STI structure 611. That is, an insulator 613 such as silicon oxide is embedded in a trench 612 formed in a surface portion of the p-type epitaxial layer 8, and the higher resistance polysilicon resistor element 61 is provided on the surface of the insulator 613. The higher resistance polysilicon resistor element 61 is formed of a non-doped or lower impurity concentration polysilicon film 614. A p-type drift layer 615 (PDRIFT) and a p-type well 616 (PW) are provided under the STI structure 611. Further, an n-type buried layer 617 (LI) is provided in the boundary between the p-type semiconductor substrate 2 and the p-type epitaxial layer 8 under the STI structure 611.

Similarly to the higher resistance polysilicon resistor element 61, the n+/p+ polysilicon resistor element 62 is provided on the surface of the insulator 613 of the STI structure 611. The n+/p+ polysilicon resistor element 62 is formed of a polysilicon film 621 doped with an n-type or p-type impurity. Therefore, the n+/p+ polysilicon resistor element 62 has a lower resistivity than the higher resistance polysilicon resistor element 61.

The active resistor element 63 is provided in a deep n-type well 631 (HVNW/DNW) provided in the p-type epitaxial layer 8. An n-type or p-type LDD layer 632 (MVNLDD/MVPLDD) is provided in a surface portion of the n-type well 631, and an $n^+$-type or $p^+$-type contact layer 633 is provided in a surface portion of the n-type or p-type LDD layer 632. The LDD layer 632 mainly contributes to electric resistance.

A deep n-type well 641 (HVNW/DNW) for the p-type well resistor element 64 is provided in the p-type epitaxial layer 8. A shallow p-type well 642 (PW) is provided in a surface portion of the p-type well 641. A pair of p-type LDD layers 643 (MVPLDD) are provided in spaced relation in a surface portion of the p-type well 642, and a pair of $p^+$-type contact layers 644 are respectively provided in surface portions of the p-type LDD layers 643. The p-type well 641 mainly contributes to electric resistance between the pair of $p^+$-type contact layers 644. An STI structure 645 is provided between the pair of p-type LDD layers 643.

The MIM capacitor element 65 is provided in a multi-level interconnection structure 9 formed on the p-type epitaxial layer 8. In this embodiment, an STI structure 651 is provided in a surface portion of the p-type epitaxial layer 8 under the MIM capacitor element 65. The STI structure 651 is formed by embedding an insulator 653 such as silicon oxide in a trench 652 formed by digging the p-type epitaxial layer 8 from the surface of the p-type epitaxial layer 8, and the multi-level interconnection structure 9 is disposed on the surface of the insulator 653. The MIM capacitor element 65 includes a lower electrode film 654, an upper electrode film 655 and a capacitance film 656 of an insulator (e.g., silicon nitride film) held between the lower and upper electrode films 654, 655. The upper electrode film 655 and the lower electrode film 654 are respectively connected to interconnection films 94, 95 through vias 92, 93 (e.g., tungsten plugs) extending through an inter-level film 91 of the multi-level interconnection structure 9. A p-type drift layer 657 (PDRIFT) and a p-type well 658 (PW) are provided under the STI structure 651. Further, an n-type buried layer 659 (LI) is provided in the boundary between the p-type semiconductor substrate 2 and the p-type epitaxial layer 8 under the STI structure 651.

Figure 6:
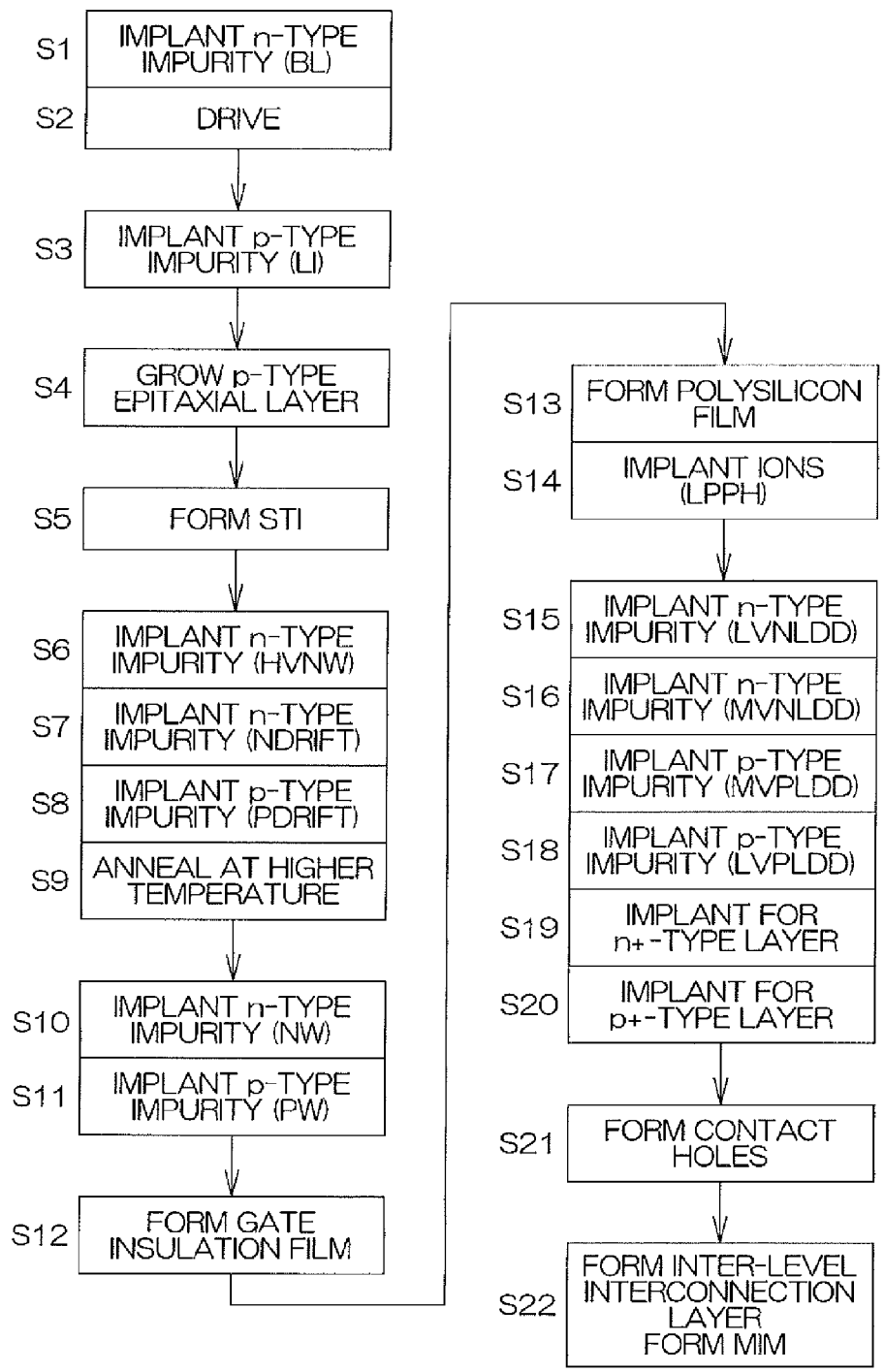
FIG. 6 is a diagram for explaining a process for fabricating the semiconductor composite device.

FIG. 6 is a diagram for explaining a process for fabricating the semiconductor composite device 1 described above. A p-type semiconductor substrate 2 is prepared, and ion implantation is performed on a surface of the semiconductor substrate 2 for the n-type buried layers BL (S1). An example of the n-type impurity ions to be implanted is arsenic ions. For example, the dose is about $4 \times 10^{15}$ cm$^{-2}$, and the acceleration energy is about 70 keV. Thereafter, a driving process (heat treatment) is performed for activation of the implanted ions (S2). Then, ion implantation for the p-type buried layers LI is performed (S3). In this case, the p-type impurity concentration is not greater than one tenth the n-type impurity concentration of the n-type buried layers BL. More specifically, an example of the p-type impurity ion to be implanted is boron ions. For example, the dose is about $1 \times 10^{14}$ cm$^{-2}$, and the acceleration energy is about 150 keV.

In turn, a p-type epitaxial layer 8 is grown on the p-type semiconductor substrate 2 (S4). More specifically, the p-type epitaxial layer 8 is formed by epitaxially growing silicon crystal while adding a p-type impurity (e.g., boron). The p-type epitaxial layer 8 has a thickness of, for example, about 5 μm. The n-type impurity and the p-type impurity implanted into the p-type semiconductor substrate 2 are diffused into the p-type semiconductor substrate 2 and the p-type epitaxial layer 8 by heat applied during the epitaxial growth. Thus, the n-type buried layers BL are formed in the boundary between the p-type semiconductor substrate 2 and the p-type epitaxial layer 8, and the p-type buried layers LI are formed in contact with upper surfaces of the n-type buried layers BL in some regions.

Subsequently, the STI structures 7, 346, 357, 373, 450, 463, 536, 611, 645, 651 are formed (S5). More specifically, trenches are selectively formed at STI structure formation positions. Thereafter, an insulation film (e.g., silicon oxide film) is formed to a thickness sufficient to fill the trenches, and then an unnecessary portion of the insulation film outside the trenches is removed and the surface of the resulting insulation film is planarized.

Then, n-type impurity ions are implanted into regions to be formed with the deep n-type wells HVNW (S6). For example, phosphorus ions are used as the n-type impurity ions, and a double injection process is performed by implantation at a dose of about $3.4 \times 10^{12}$ cm$^{-2}$ at an acceleration energy of about 190 keV and implantation at a dose of about $1 \times 10^{14}$ cm$^{-2}$ at an acceleration energy of about 190 keV. Further, n-type impurity ions are implanted into regions to be formed with the n-type drift layers NDRIFT, the n-channel DMOS drain and the medium breakdown voltage p-channel MOS wells (S7). For example, phosphorus ions are used as the n-type impurity ions, and the ion implantation is performed at a dose of about $6 \times 10^{12}$ cm$^{-2}$ at an acceleration energy of about 200 keV. Further, p-type impurity ions are implanted into regions to be formed with the p-type drift layers PDRIFT (S8). For example, boron ions are used as the p-type impurity ions, and the ion implantation is performed at a dose of about $6.0 \times 10^{12}$ cm$^{-2}$ at an acceleration energy of about 180 keV. Thereafter, a higher temperature annealing process is performed for heat treatment (S9), whereby the implanted n-type impurity ions and the p-type impurity ions are activated.

Subsequently, n-type impurity ions are implanted into regions to be formed with the shallow n-type wells NW (S10). For example, arsenic ions and phosphorus ions are used as the n-type impurity ions. With the use of the arsenic ions, the ion implantation is performed once at a dose of about $3.86 \times 10^{12}$ cm$^{-2}$ at an acceleration energy of about 25 keV. With the use of the phosphorus ions, a double implantation process is performed by implantation at an acceleration energy of about 220 keV at a dose of about $7.5 \times 10^{12}$ cm$^{-2}$ and implantation at an acceleration energy of about 500 keV at a dose of about $1.07 \times 10^{13}$ cm$^{-2}$. Further, p-type impurity ions are implanted into regions to be formed with the shallow p-type wells PW (S11). For example, boron ions are used as the p-type impurity ions, and a triple implantation process is performed by implantation at an acceleration energy of about 10 keV at a dose of about $1.365 \times 10^{13}$ cm$^{-2}$, implantation at an acceleration energy of about 100 keV at a dose of about $9.0 \times 10^{12}$ cm$^{-2}$, and implantation at an acceleration energy of about 180 keV at a dose of about $1.0 \times 10^{13}$ cm$^{-2}$.

Thereafter, the gate insulation films 318, 344, 328, 355, 361, 371, 418, 428, 461, 490, 580 (e.g., silicon oxide films) for the MOS transistors 31 to 33, 41 to 44 and 55 are formed, for example, by a thermal oxidation process (S12). The impurity ions previously implanted are activated by heat applied during the formation of the gate insulation films. The gate insulation films each have a thickness according to the breakdown voltage of the corresponding MOS transistor. Specifically, the gate insulation films are formed as having different thicknesses by selectively forming thermal oxide films a plurality of times through the thermal oxidation process. More specifically, the gate insulation films for the DMOS transistors and the medium breakdown voltage MOS transistors are first formed. Then, portions of the epitaxial layer to be formed with gate oxide films for the lower breakdown voltage MOS transistors are etched, and insulation films for the lower breakdown voltage MOS transistors are formed in these portions. Before the etching, phosphorus ions are implanted into a region for the lower breakdown voltage MOS transistors at an acceleration energy of about 1800 keV at a dose of about $6.92\times10^{12}$ cm$^{-2}$, whereby the shallow well DNW is formed in the lower breakdown voltage region.

Next, a polysilicon film for the gate electrodes 319, 345, 329, 356, 362, 372, 419, 429, 462, 491, 581, the higher resistance polysilicon resistor element 61 and the n$^+$/p$^+$ polysilicon resistor element is deposited, and an unnecessary portion of the polysilicon film is removed (S13). Then, ions are selectively implanted into a portion of the polysilicon film for the higher resistance polysilicon resistor element 61 (LPPH (boron) implantation), whereby the higher resistance polysilicon resistor element 61 is formed as having a higher resistivity (e.g., having a sheet resistance of 4 KΩ☐) (S14).

In turn, n-type impurity ions are selectively implanted into a region for the n-type LDD layer LVNLDD (for the transistor having a breakdown voltage of 1.5 V) (S15). For example, arsenic ions and BF$_2$ ions are used as the n-type impurity ions. A double implantation process is performed by implanting the arsenic ions at a dose of about $4.00\times10^{14}$ cm$^{-2}$ at an acceleration energy of about 4 keV and then implanting the BF$_2$ ions at a dose of about $1.80\times10^{14}$ cm$^{-2}$ at an acceleration energy of about 44 keV. Further, n-type impurity ions are selectively implanted into regions for the n-type LDD layers MVNLDD (for the transistor having a breakdown voltage of 5 V, and the like) (S16). For example, phosphorus ions are used as the n-type impurity ions, and the ion implantation is performed at a dose of about $2.50\times10^{13}$ cm$^{-2}$ at an acceleration energy of about 80 keV. Further, p-type impurity ions are selectively implanted into regions of the p-type LDD layers MVPLDD (for the transistor having a breakdown voltage of 5 V, and the like) (S17). For example, BF$_2$ ions are used as the p-type impurity ions, and the ion implantation is performed at a dose of about $3.00\times10^{13}$ cm$^{-2}$ at an acceleration energy of about 60 keV. Further, p-type impurity ions are selectively implanted into a region for the p-type LDD layer LVPLDD (for the transistor having a breakdown voltage of 1.5 V) (S18). For example, BF$_2$ ions are used as the p-type impurity ions, and the ion implantation is performed at a dose of about $1.00\times10^{14}$ cm$^{-2}$ at an acceleration energy of about 2 keV. Further, phosphorus ions are implanted at an acceleration energy of about 45 keV at a dose of $3.50\times10^{13}$ cm$^{-2}$ for pocket implantation.

Further, n-type impurity ions are selectively implanted into regions for the n$^+$-type layers 315, 316, 325, 326, 338, 339, 415, 416, 425, 426, 438, 439, 466, 516, 517, 560, 538, 548, 570 (S19). For example, arsenic ions are used as the n-type impurity ions, and the implantation is performed at a dose of about $3.40\times10^{15}$ cm$^{-2}$ at an acceleration energy of about 70 keV. Further, p-type impurity ions are selectively implanted in regions for the p$^+$-type layers 341, 342, 352, 353, 368, 369, 446, 448, 515, 525, 526, 528, 537, 547, 556, 558, 644 (S20). For example, boron ions are used as the p-type impurity ions, and the implantation is performed at a dose of about $1.60\times10^{15}$ cm$^{-2}$ at an acceleration energy of about 3 keV. Simultaneously with the ion implantation for the n$^+$-type layers or the p$^+$-type layers, the ions may be implanted into a portion of the polysilicon film for the n$^+$/p$^+$ polysilicon resistor element 62.

Contact holes are formed to expose electrode connection portions of the respective elements (S21). More specifically, openings are formed in the gate insulation films provided in the surface of the p-type epitaxial layer 8 to expose the n$^+$-type layers 315, 316, 325, 326, 338, 339, 415, 416, 425, 426, 438, 439, 466, 516, 517, 560, 538, 548, 570 and the p$^+$-type layers 341, 342, 352, 353, 368, 369, 446, 448, 515, 525, 526, 528, 537, 547, 556, 558, 644.

Thereafter, the inter-level interconnection structure 9 is formed (S22). The formation of the inter-level interconnection structure 9 is achieved by forming an interconnection film, patterning the interconnection film, forming the inter-level film and forming vias in the inter-level film. The MIM capacitor element 65 is formed during the formation of the inter-level interconnection structure 9 (S22).

Through the series of steps described above, the semiconductor composite device 1 is fabricated, which includes the CMOS transistors 31 to 33, the n-channel double diffusion MOS transistors 41 to 43, the p-channel double diffusion MOS transistor 44, the bipolar elements 51 to 55 and the passive elements 61 to 65.

While the present invention has thus been described by way of one embodiment thereof, the invention may be embodied in other ways. For example, silicide layers (indicated by bold lines in FIGS. 1 to 5C) may be formed on surfaces of the n$^+$-type layers 315, 316, 325, 326, 338, 339, 415, 416, 425, 426, 438, 439, 466, 516, 517, 560, 538, 548, 570 and the p$^+$-type layers 341, 342, 352, 353, 368, 369, 446, 448, 515, 525, 526, 528, 537, 547, 556, 558, 644 to reduce the contact resistances. Further, silicide layers (indicated by bold lines in FIGS. 1 to 5C) may be formed on surfaces of the gate electrodes of the polysilicon films to reduce the resistances of the gate electrodes.

The BiCDMOS element is merely required to include at least one n-channel double diffusion MOS transistor, at least one CMOS element and at least one bipolar element provided on the common semiconductor substrate, and the passive elements are not necessarily required to be provided on the common semiconductor substrate.

Further, the n-channel double diffusion MOS transistor according to the present invention is not necessarily required to be incorporated in the semiconductor composite device.

The impurity ion species, the doses and the acceleration energies are shown by way of example, and may be arbitrarily determined.

The present application corresponds to Japanese Patent Application No. 2013-012276 filed in the Japan Patent Office on Jan. 25, 2013, and the entire disclosure of the application is incorporated herein by reference.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A n-channel double diffusion MOS transistor, comprising:
   a p-type semiconductor substrate;
   a p-type epitaxial layer formed on the p-type semiconductor substrate through epitaxial growth;
   a n-type buried layer provided in a boundary between the p-type semiconductor substrate and the p-type epitaxial layer;
   a p-type body layer provided in a surface portion of the p-type epitaxial layer;
   a n-type source layer provided in the p-type body layer and defining a double diffusion structure together with the p-type body layer;
   a n-type drift layer provided in a surface portion of the p-type epitaxial layer in spaced relation from the p-type body layer to define a channel region between the n-type source layer and the n-type drift layer;

a n-type drain layer provided in a surface portion of the p-type epitaxial layer in spaced relation from the channel region and in contact with the n-type drift layer;

a p-type buried layer buried in the p-type epitaxial layer between the n-type drift layer and the n-type buried layer and being in contact with an upper surface of the n-type buried layer, and being absent from a region present under the p-type body layer, and being spaced apart from the n-type drift layer, and having a lower impurity concentration than the n-type buried layer;

a gate insulation film provided in a surface of the p-type epitaxial layer on the channel region; and a gate electrode provided in opposed relation to the channel region with intervention of the gate insulation film.

2. The n-channel double diffusion MOS transistor according to claim 1, wherein the n-type buried layer continuously extends through a region at least including regions present under the p-type body layer, the channel region, the n-type drift layer, the n-type source layer and the n-type drain layer.

3. The n-channel double diffusion MOS transistor according to claim 1, wherein the p-type buried layer is provided in a region including regions present under the n-type drift layer and the n-type drain layer.

4. The n-channel double diffusion MOS transistor according to claim 1, further comprising an insulator buried structure provided between the n-type drain layer and the channel region in the n-type drift layer to extend a current path in the n-type drift layer.

5. The n-channel double diffusion MOS transistor according to claim 1, further comprising an n-type well provided in contact with the n-type buried layer to surround the p-type body layer, the channel region, the n-type drift layer, the n-type source layer and the n-type drain layer to define an active region.

6. A semiconductor composite device comprising:
a n-channel double diffusion MOS transistor as recited in claim 1;
a CMOS element provided on the p-type semiconductor substrate; and
a bipolar element provided on the p-type semiconductor substrate.

7. The semiconductor composite device according to claim 6, further comprising at least one functional element selected from the group consisting of a p-channel DMOS transistor, a p-channel MOS transistor, an n-channel MOS transistor, a resistor element, a capacitor element and a diode element.

8. The n-channel double diffusion MOS transistor according to claim 1, wherein the p-type epitaxial layer is present in a space between the p-type buried layer and the n-type drift layer.

9. The n-channel double diffusion MOS transistor according to claim 1, wherein the impurity concentration of the n-type buried layer is not less than 10 times the impurity concentration of the p-type buried layer.

10. A n-channel double diffusion MOS transistor comprising:
a p-type semiconductor substrate;
a p-type epitaxial layer formed on the p-type semiconductor substrate through epitaxial growth;
a n-type buried layer provided in a boundary between the p-type semiconductor substrate and the p-type epitaxial layer;
a p-type body layer provided in a surface portion of the p-type epitaxial layer;

a n-type source layer provided in the p-type body layer and defining a double diffusion structure together with the p-type body layer;

a n-type drift layer provided in a surface portion of the p-type epitaxial layer in spaced relation from the p-type body layer to define a channel region between the n-type source layer and the n-type drift layer;

a n-type drain layer provided in a surface portion of the p-type epitaxial layer in spaced relation from the channel region and in contact with the n-type drift layer;

a p-type buried layer buried in the p-type epitaxial layer between the n-type drift layer and the n-type buried layer and being in contact with an upper surface of the n-type buried layer, and being absent from a region present under the channel region, and being spaced apart from the n-type drift layer, and having a lower impurity concentration than the n-type buried layer;

a gate insulation film provided in a surface of the p-type epitaxial layer on the channel region; and a gate electrode provided in opposed relation to the channel region with intervention of the gate insulation film.

11. The n-channel double diffusion MOS transistor according to claim 10, wherein the n-type buried layer continuously extends through a region at least including regions present under the p-type body layer, the channel region, the n-type drift layer, the n-type source layer and the n-type drain layer.

12. The n-channel double diffusion MOS transistor according to claim 10, wherein the p-type buried layer is provided in a region including regions present under the n-type drift layer and the n-type drain layer.

13. The n-channel double diffusion MOS transistor according to claim 10, further comprising an insulator buried structure provided between the n-type drain layer and the channel region in the n-type drift layer to extend a current path in the n-type drift layer.

14. The n-channel double diffusion MOS transistor according to claim 10, further comprising an n-type well provided in contact with the n-type buried layer to surround the p-type body layer, the channel region, the n-type drift layer, the n-type source layer and the n-type drain layer to define an active region.

15. A semiconductor composite device comprising:
an n-channel double diffusion MOS transistor as recited in claim 10;
a CMOS element provided on the p-type semiconductor substrate; and
a bipolar element provided on the p-type semiconductor substrate.

16. The semiconductor composite device according to claim 15, further comprising at least one functional element selected from the group consisting of a p-channel DMOS transistor, a p-channel MOS transistor, an n-channel MOS transistor, a resistor element, a capacitor element and a diode element.

17. The n-channel double diffusion MOS transistor according to claim 10, wherein the p-type epitaxial layer is present in a space between the p-type buried layer and the n-type drift layer.

18. The n-channel double diffusion MOS transistor according to claim 10, wherein the impurity concentration of the n-type buried layer is not less than 10 times the impurity concentration of the p-type buried layer.

* * * * *